United States Patent
Kumagai

(10) Patent No.: US 10,356,348 B2
(45) Date of Patent: Jul. 16, 2019

(54) SOLID-STATE IMAGE CAPTURE ELEMENT, DRIVING METHOD, AND ELECTRONIC DEVICE

(71) Applicant: SONY CORPORATION, Tokyo (JP)

(72) Inventor: Yoshimichi Kumagai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/560,567

(22) PCT Filed: Mar. 18, 2016

(86) PCT No.: PCT/JP2016/058648
§ 371 (c)(1),
(2) Date: Sep. 22, 2017

(87) PCT Pub. No.: WO2016/158483
PCT Pub. Date: Oct. 6, 2016

(65) Prior Publication Data
US 2018/0054579 A1   Feb. 22, 2018

(30) Foreign Application Priority Data

Apr. 3, 2015  (JP) .................................. 2015-076686

(51) Int. Cl.
*H04N 5/363* (2011.01)
*H04N 5/3745* (2011.01)
(Continued)

(52) U.S. Cl.
CPC ....... *H04N 5/363* (2013.01); *H01L 27/14614* (2013.01); *H01L 27/14641* (2013.01);
(Continued)

(58) Field of Classification Search
CPC .. H04N 5/363; H04N 5/37452; H04N 5/3592; H01L 27/14656
See application file for complete search history.

(56) References Cited

U.S. PATENT DOCUMENTS

| 8,785,834 B2 | 7/2014 | Sakano | |
|---|---|---|---|
| 2011/0234836 A1* | 9/2011 | Machida | H01L 27/14603 348/222.1 |
| 2016/0155768 A1* | 6/2016 | Yi | H01L 27/14643 250/208.1 |

FOREIGN PATENT DOCUMENTS

| CN | 102202189 A | 9/2011 |
|---|---|---|
| CN | 103685999 A | 3/2014 |

(Continued)

OTHER PUBLICATIONS

International Search Report and Written Opinion of PCT Application No. PCT/JP2016/058648, dated Jun. 7, 2016, 08 pages of ISRWO.

*Primary Examiner* — Ahmed A Berhan
(74) *Attorney, Agent, or Firm* — Sheridan Ross P.C.

(57) ABSTRACT

The present disclosure relates to a solid-state image capture element in which, at least two or more of the discharge driving units are arranged in series between the photoelectric conversion unit and the discharge unit. During capturing of a still image, when a reset operation of the photoelectric conversion unit is performed in starting exposure of the pixel, driving is performed such that after potentials of all the discharge driving units arranged in series are reduced and the charge remaining in the photoelectric conversion unit is discharged to the discharge unit, the potential of the discharge driving unit on the photoelectric conversion unit side is returned to an original potential first, and then the potential of another discharge driving unit is returned to an original potential. The present technology can be applied to a CMOS image sensor which performs imaging by, for example, a global shutter method.

8 Claims, 22 Drawing Sheets

(51) Int. Cl.
*H04N 5/359* (2011.01)
*H01L 27/146* (2006.01)
*H04N 5/357* (2011.01)

(52) U.S. Cl.
CPC .. *H01L 27/14643* (2013.01); *H01L 27/14656* (2013.01); *H04N 5/3575* (2013.01); *H04N 5/3592* (2013.01); *H04N 5/3597* (2013.01); *H04N 5/37452* (2013.01)

(56) References Cited

FOREIGN PATENT DOCUMENTS

| | | |
|---|---|---|
| JP | 2011-204878 A | 10/2011 |
| JP | 2014-060519 A | 4/2014 |
| JP | 2016-066766 A | 4/2016 |
| KR | 10-2011-0107750 A | 10/2011 |

\* cited by examiner

SOLID-STATE IMAGE CAPTURE ELEMENT, DRIVING METHOD, AND ELECTRONIC DEVICE

CROSS REFERENCE TO RELATED APPLICATIONS

This application is a U.S. National Phase of International Patent Application No. PCT/JP2016/058648 filed on Mar. 18, 2016, which claims priority benefit of Japanese Patent Application No. JP 2015-076686 filed in the Japan Patent Office on Apr. 3, 2015. Each of the above-referenced applications is hereby incorporated herein by reference in its entirety.

TECHNICAL FIELD

The present disclosure relates to a solid-state image capture element, a driving method, and an electronic device, and particularly, relates to a solid-state image capture element, a driving method, and an electronic device which are enabled to capture a high-quality image.

BACKGROUND ART

Conventionally, in an electronic device with an imaging function, such as a digital still camera or a digital video camera, for example, a solid-state image capture element, such as a charge coupled device (CCD) or a complementary metal oxide semiconductor (CMOS) image sensor is used. The solid-state image capture element has a pixel in which a photodiode (PD) that performs photoelectric conversion and a plurality of transistors are combined, and an image is constructed on the basis of pixel signals output from a plurality of pixels arranged in an image plane on which an image of a subject is formed.

In general, in a CMOS image sensor, imaging is sequentially performed by a rolling shutter method for reading charges generated in a PD for each row on which pixels are arranged.

In contrast, in recent years, there has been developed a CMOS image sensor which has a structure having a memory unit that temporarily holds, in a pixel, charges generated in a PD and performs imaging by a global shutter method for realizing simultaneous charge storage by concurrently transferring the charges from the PD to the memory unit.

Meanwhile, in the CMOS image sensor of a structure to perform imaging by the global shutter method, in order to capture a moving image having no interruption, it is necessary to store charges in the PD and hold the charges in the memory unit in parallel. Therefore, during capturing of a moving image, in order to suppress blooming from the PD to the memory unit, it is preferable to form a lower potential of an overflow gate for overflowing charges generated larger than a stored charge amount of the PD.

On the other hand, during capturing of a still image, it is not necessary to store charges in the PD and hold the charges in the memory unit in parallel, and thus it is not necessary to form a path for overflowing charges from the PD.

Therefore, a configuration suitable for capturing a moving image in which the potential of the overflow gate is formed low is not suitable for capturing a still image. That is, in view of the entire imaging system, it is necessary to reduce the potential of the overflow gate, and as a result, a stored charge amount of the PD decreases.

Accordingly, the applicant of the present application suggests a solid-state image capture element capable of switching of a potential of an overflow gate between a still image and a moving image (see e.g., Patent Literature 1).

CITATION LIST

Patent Literature

Patent Literature 1: JP2014-060519A

DISCLOSURE OF INVENTION

Technical Problem

Meanwhile, the solid-state image capture element disclosed in Patent Literature 1 is configured to switch a potential of an overflow gate by changing an electric potential of an overflow drain, and thus it is apprehended that, when an overflow drain is made to a lower voltage, the charges flow back from the overflow drain to the PD. As such, the charges flown back from the overflow drain to the PD may adversely affect image quality, resulting in deterioration of image quality.

The present disclosure is devised in consideration of the situations, and makes it possible to capture a higher-quality image.

Solution to Problem

A solid-state image capture element of an aspect of the present disclosure includes a plurality of pixels each including: a photoelectric conversion unit configured to convert incident light into a charge by photoelectric conversion and store the charge; a discharge unit configured to discharge a charge remaining in the photoelectric conversion unit; and a discharge driving unit configured to be driven when a charge is discharged from the photoelectric conversion unit to the discharge unit. At least two or more of the discharge driving units are arranged in series between the photoelectric conversion unit and the discharge unit.

A driving method of an aspect of the present disclosure is a driving method of a solid-state image capture element, the solid-state image capture element including a plurality of pixels each including a photoelectric conversion unit configured to convert incident light into a charge by photoelectric conversion and store the charge, a discharge unit configured to discharge a charge remaining in the photoelectric conversion unit, and a discharge driving unit configured to be driven when a charge is discharged from the photoelectric conversion unit to the discharge unit. At least two or more of the discharge driving units are arranged in series between the photoelectric conversion unit and the discharge unit. The driving method includes: during capturing of a still image, when a reset operation of the photoelectric conversion unit is performed in starting exposure of the pixel, performing driving such that after potentials of all the discharge driving units arranged in series are reduced and the charge remaining in the photoelectric conversion unit is discharged to the discharge unit, the potential of the discharge driving unit on the photoelectric conversion unit side is returned to an original potential first, and then the potential of another discharge driving unit is returned to an original potential.

An electronic device of an aspect of the present disclosure includes: a solid-state image capture element including a plurality of pixels each including a photoelectric conversion unit configured to convert incident light into a charge by photoelectric conversion and store the charge, a discharge unit configured to discharge a charge remaining in the photoelectric conversion unit, and a discharge driving unit configured to be driven when a charge is discharged from the photoelectric conversion unit to the discharge unit. At least two or more of the discharge driving units are arranged in series between the photoelectric conversion unit and the discharge unit.

In an aspect of the present disclosure, a plurality of pixels each including: a photoelectric conversion unit configured to convert incident light into a charge by photoelectric conversion and store the charge; a discharge unit configured to discharge a charge remaining in the photoelectric conversion unit; and a discharge driving unit configured to be driven when a charge is discharged from the photoelectric conversion unit to the discharge unit are included. At least two or more of the discharge driving units are arranged in series between the photoelectric conversion unit and the discharge unit. During capturing of a still image, when a reset operation of the photoelectric conversion unit is performed in starting exposure of the pixel, driving is performed such that after potentials of all the discharge driving units arranged in series are reduced and the charge remaining in the photoelectric conversion unit is discharged to the discharge unit, the potential of the discharge driving unit on the photoelectric conversion unit side is returned to an original potential first, and then the potential of another discharge driving unit is returned to an original potential.

Advantageous Effects of Invention

According to an aspect of the present disclosure, a higher-quality image can be captured.

MODE(S) FOR CARRYING OUT THE INVENTION

Hereinbelow, a specific description is given of specific embodiments to which the present technology is applied with reference to the drawings.

Figure 1:
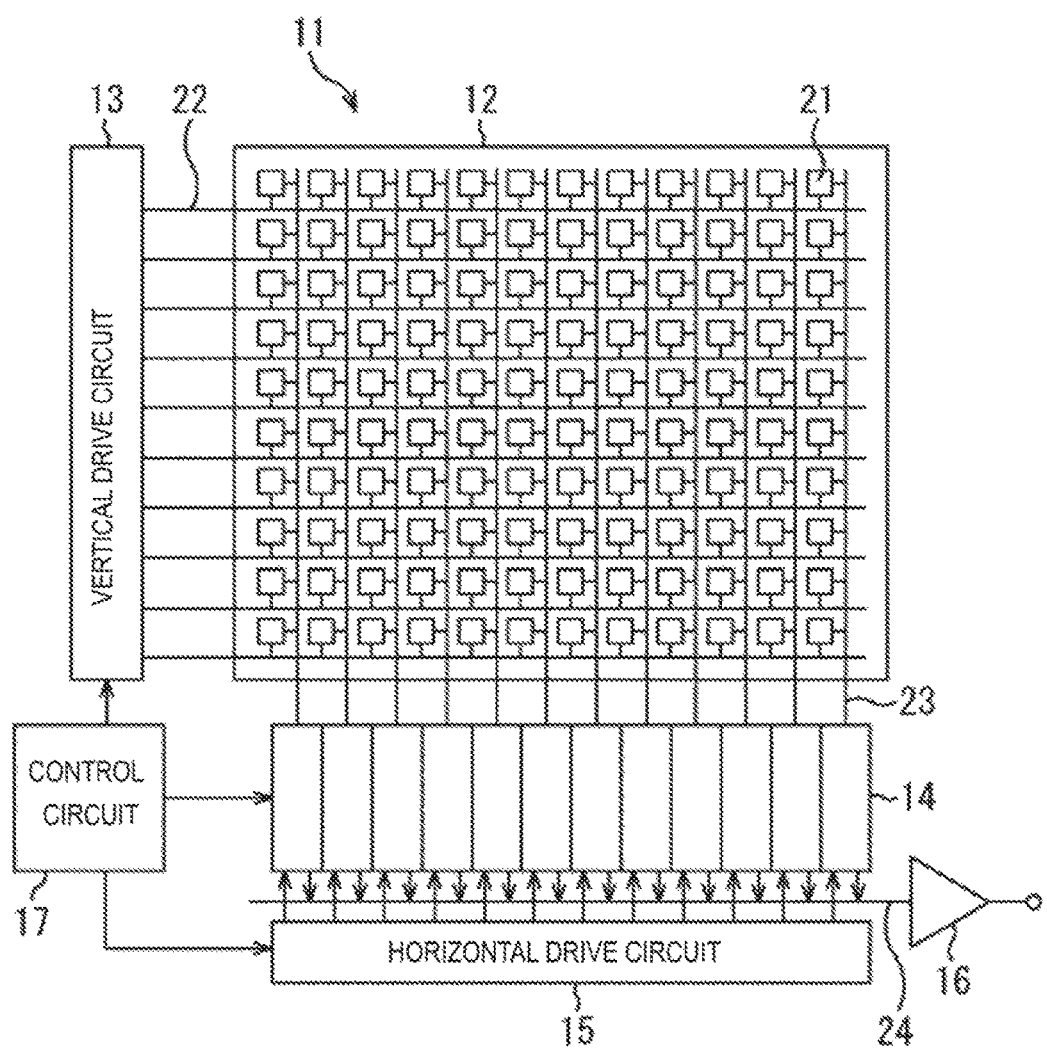
FIG. 1 is a block diagram showing a configuration example of an embodiment of an image capture element to which the present technology is applied.

FIG. 1 is a block diagram showing a configuration example of an embodiment of an image capture element to which the present technology is applied.

As shown in FIG. 1, an image capture element 11 includes a pixel region 12, a vertical drive circuit 13, a column signal processing circuit 14, a horizontal drive circuit 15, an output circuit 16, and a control circuit 17.

The pixel region 12 is a light receiving surface that receives light collected by an optical system (not shown). In the pixel region 12, a plurality of pixels 21 is arranged in a matrix, and each pixel 21 is connected to the vertical drive circuit 13 via a horizontal signal line 22 for each row and to the column signal processing circuit 14 via a vertical signal line 23 for each column. The plurality of pixels 21 outputs pixel signals at levels in accordance with the amount of light received, respectively, and images of the subject formed in the pixel region 12 are constructed from the pixel signals.

The vertical drive circuit 13 sequentially supplies a drive signal for driving (transferring, selecting, resetting, etc.) each pixel 21 to the pixel 21 via the horizontal signal line 22, for each row of the plurality of pixels 21 arranged in the pixel region 12. The column signal processing circuit 14 performs correlated double sampling (CDS) processing on pixel signals output from the plurality of pixels 21 via the vertical signal lines 23, and thereby performs AD conversion of the pixel signals and removes the reset noise.

The horizontal drive circuit 15 sequentially supplies drive signals for outputting pixel signals from the column signal processing circuit 14 to a data output signal line 24, to the column signal processing circuit 14, for each column of the plurality of pixels 21 arranged in the pixel region 12. The output circuit 16 amplifies the pixel signal supplied from the column signal processing circuit 14 via the data output signal line 24 at timing according to the drive signals of the horizontal drive circuit 15, and outputs the amplified pixel signal to a signal processing circuit in a later stage. The control circuit 17 generates and supplies, for example, a clock signal according to the drive period of each block of the image capture element 11 and thereby controls the drive of each block.

An image capture element 11 thus configured is driven by a global shutter method which realizes simultaneous charge storage in all the pixels 21. As a result, the image capture element 11 can capture an image that does not cause a distortion which may occur in imaging by, for example, a rolling shutter method.

Figure 2:
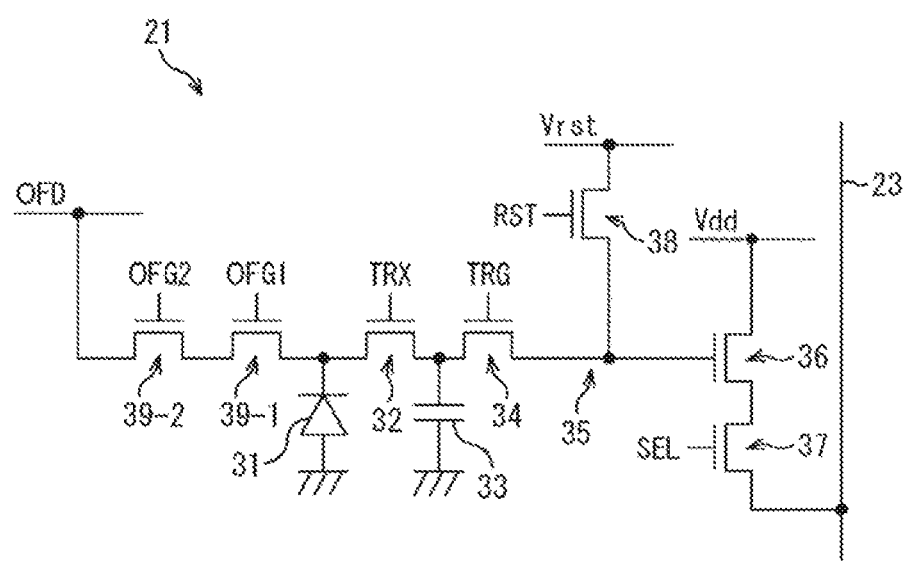
FIG. 2 is a circuit diagram showing a configuration example of a pixel.

Next, FIG. 2 is a circuit diagram showing a configuration example of the pixel 21.

As shown in FIG. 2, the pixel 21 includes a PD 31, a first transfer transistor 32, a memory unit 33, a second transfer transistor 34, an FD unit 35, an amplification transistor 36, a select transistor 37, a reset transistor 38, and two discharge transistors 39-1 and 39-2.

The PD 31 is a photoelectric conversion unit configured to convert incident light into charges by photoelectric conversion and accumulate the charges, and the anode terminal of PD 31 is grounded, and the cathode terminal thereof is connected to the first transfer transistor 32 and the discharge transistor 39-1.

The first transfer transistor 32 is driven in accordance with a transfer signal TRX supplied from a vertical drive circuit 13, and when the first transfer transistor 32 is turned on, charges stored in the PD 31 are transferred to the memory unit 33.

Figure 3:
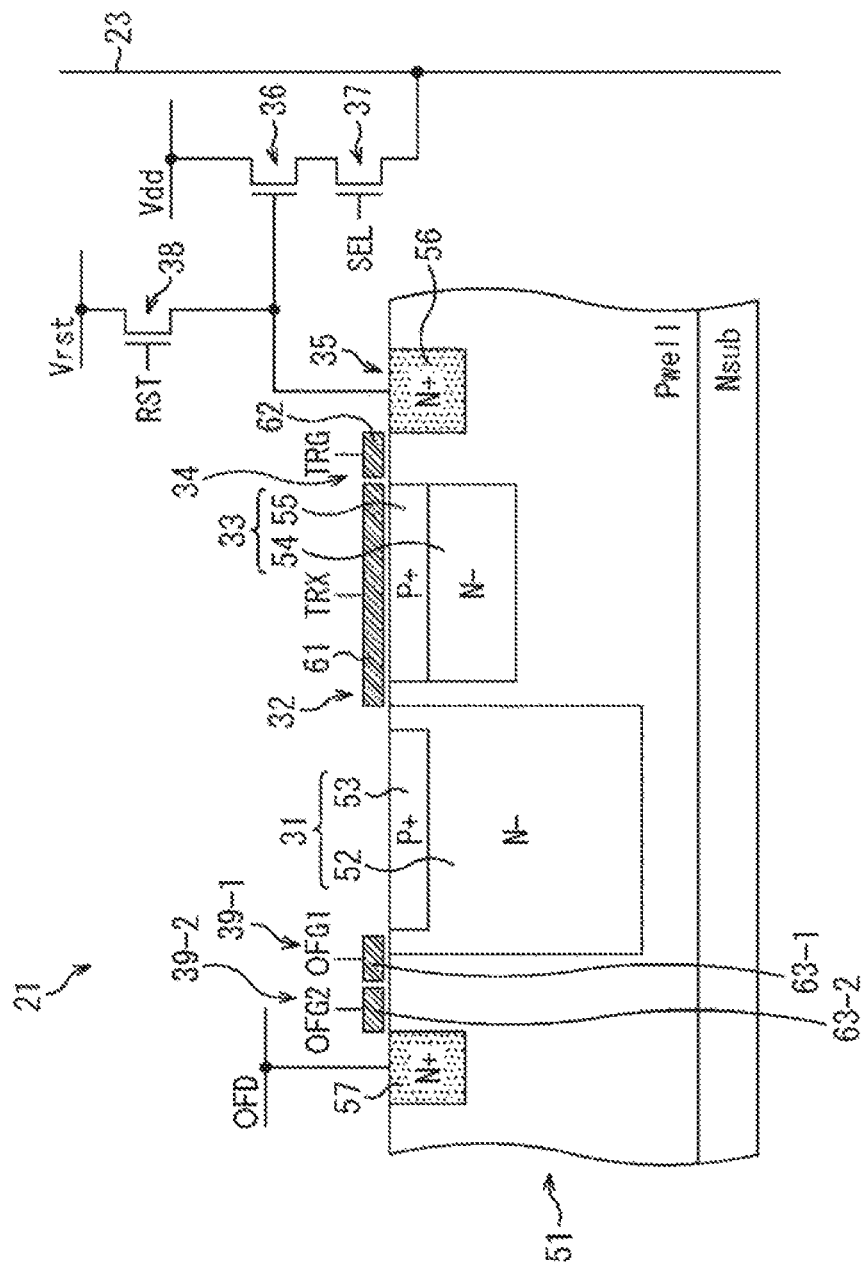
FIG. 3 is an explanatory diagram of a cross-sectional configuration example of the pixel.

The memory unit 33 is, for example, as shown in FIG. 3 which will be described below, an embedded and lower-noise charge holding unit that is configured by implanting an N-type impurity in a P well, and temporarily holds the charges transferred from the PD 31 via the first transfer transistor 32.

The second transfer transistor 34 is driven in accordance with a transfer signal TRG supplied from the vertical drive circuit 13, and when the second transfer transistor 34 is turned on, the charges stored in the memory unit 33 are transferred to the FD unit 35.

The FD unit 35 is a floating diffusion region having a predetermined storage capacitor which is connected to a gate electrode of the amplification transistor 36, and stores the charges transferred from the memory unit 33.

The amplification transistor 36 outputs a pixel signal of a level in accordance with charges stored in the FD unit 35 (in other words, electric potential of the FD unit 35), to a vertical signal line 23 via the select transistor 37. That is, the FD unit 35 is connected to a gate electrode of the amplification transistor 36, and thus the FD unit 35 and the amplification transistor 36 function as a conversion unit configured to convert charges generated in the PD 31 into a pixel signal of a level in accordance with the charges.

The select transistor 37 is driven in accordance with a selection signal SEL supplied from the vertical drive circuit 13, and when the select transistor 37 is turned on, a pixel signal output from the amplification transistor 36 is in a state capable of being output to the vertical signal line 23.

The reset transistor 38 is driven in accordance with a reset signal RST supplied from the vertical drive circuit 13, and when the reset transistor 38 is turned on, the charges stored in the FD unit 35 are discharged to a reset power source Vrst, and the FD unit 35 is reset.

The discharge transistors 39-1 and 39-2 are arranged in series between the PD 31 and an overflow drain OFD (discharge unit). Moreover, the discharge transistor 39-1 is driven in accordance with a discharge signal OFG1 supplied from the vertical drive circuit 13, and the discharge transistor 39-2 is driven in accordance with a discharge signal OFG2 supplied from the vertical drive circuit 13. Accordingly, when both the discharge transistors 39-1 and 39-2 are turned on, the charges stored in the PD 31 are discharged to the overflow drain OFD. Moreover, potentials of the discharge transistors 39-1 and 39-2 are set to be lower than the potential of the first transfer transistor 32 so that charges generated in the PD 31 which are equal to or greater than the storage capacitor are overflowed into the overflow drain OFD.

In the pixel 21 thus configured, after a reset operation is performed in which the charges remaining in the PD 31 are discharged via the discharge transistors 39-1 and 39-2 to the overflow drain OFD, driving is performed so as to start exposure of the PD 31.

Next, a cross-sectional configuration example of the pixel 21 will be described with reference to FIG. 3.

As shown in FIG. 3, in the pixel 21, the PD 31 is formed by a P-N junction of an N-type region 52 and a P-type region 53 formed in a P well of a semiconductor substrate 51. Moreover, the memory unit 33 is formed by an N-type region 54 and a P-type region 55 formed in an adjacent region via the first transfer transistor 32 from the PD 31. Note that, the memory unit 33 may be configured by only the N-type region 54 without formation of the P-type region 55.

Moreover, a highly-concentrated N-type region 56 having a high N-type impurity concentration that is formed in an adjacent region via the second transfer transistor 34 from the memory unit 33 is connected to a gate electrode of the amplification transistor 36 via a wiring, and functions as the FD unit 35. Moreover, the overflow drain OFD is connected via a wiring to a highly-concentrated N-type region 57 having a high N-type impurity concentration that is formed in an adjacent region via the discharge transistors 39-1 and 39-2 from the PD 31.

Moreover, a gate electrode 61 of the first transfer transistor 32, a gate electrode 62 of the second transfer transistor 34, a gate electrode 63-1 of the discharge transistor 39-1, and a gate electrode 63-2 of the discharge transistor 39-2 are laminated on the light receiving surface of the semiconductor substrate 51 via gate insulating films (now shown).

The gate electrode 61 of the first transfer transistor 32 is formed to cover a region between the PD 31 and the memory unit 33, and the entire memory unit 33. The gate electrode 62 of the second transfer transistor 34 is formed to cover a region between the memory unit 33 and the highly-concentrated N-type region 56.

The gate electrode 63-1 of the discharge transistor 39-1 and the gate electrode 63-2 of the discharge transistor 39-2 are formed to cover a region between the PD 31 and the highly-concentrated N-type region 57. As shown in the drawings, the gate electrode 63-1 of the discharge transistor 39-1 is arranged on the PD 31 side, and the gate electrode 63-2 of the discharge transistor 39-2 is arranged on the highly-concentrated N-type region 57 side. As such, the gate electrode 63-1 of the discharge transistor 39-1 and the gate electrode 63-2 of the discharge transistor 39-2 are arranged in series from the PD 31 toward the highly-concentrated N-type region 57.

The pixel 21 thus configured can transfer the charges generated in the PD 31 to the memory unit 33 and temporarily hold the charges in the memory unit 33 until a timing comes when pixel signals of the pixel 21 are read. As a result, in the plurality of pixels 21, exposure is simultaneously started, and the charges are concurrently transferred from the PD 31 to the memory unit 33, so that the exposure can be simultaneously terminated.

Figure 4:
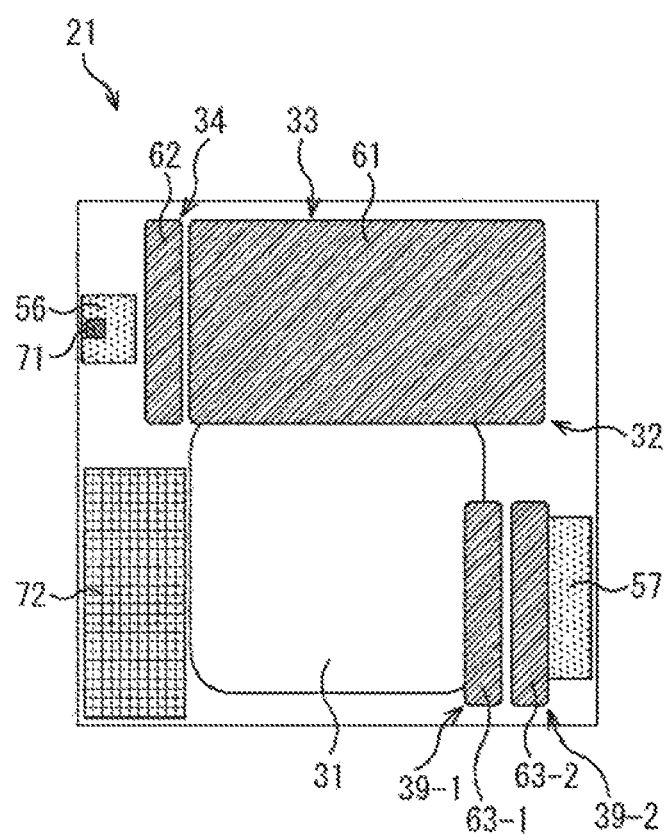
FIG. 4 is a diagram showing a first exemplary layout of the pixel.

FIG. 4 is a first exemplary layout showing a planar configuration of the pixel 21.

As shown in FIG. 4, in the pixel 21, when a direction in which the PD 31 and the memory unit 33 are arranged is a vertical direction, the PD 31 is arranged on the lower side, and the memory unit 33 is arranged on the upper side. Note that, the memory unit 33 is covered by the gate electrode 61 of the first transfer transistor 32.

Moreover, in the pixel 21, the highly-concentrated N-type region 56 is arranged via the second transfer transistor 34 on the left side of FIG. 4 with respect to the memory unit 33, and a wiring 71 for connecting the gate electrode of the amplification transistor 36 is connected to the highly-concentrated N-type region 56.

Further, in the pixel 21, the highly-concentrated N-type region 57 is arranged via the discharge transistors 39-1 and 39-2 on the right side of FIG. 4 with respect to the PD 31. Moreover, in the pixel 21, a pixel transistor region 72 for forming the amplification transistor 36, the select transistor 37, and the reset transistor 38 shown in FIG. 3 is arranged on a side opposite (on the left side of FIG. 4) to a side on which the highly-concentrated N-type region 57 is arranged with respect to the PD 31.

As such, the pixel 21 has a structure in which the discharge transistors 39-1 and 39-2 are arranged in series between the PD 31 and the highly-concentrated N-type region 57. Moreover, in the pixel 21, it is not necessary to arrange the discharge transistors 39-1 and 39-2 adjacent to the memory unit 33. Moreover, the pixel 21 has a layout in which the discharge transistors 39-1 and 39-2 are arranged for the PD 31 on a side opposite to a side on which the second transfer transistor 34 is arranged for the memory unit 33.

The pixel 21 is configured as described above, and a potential of the overflow gate for discharging charges from the PD 31 to the overflow drain OFD is switched by the discharge signal OFG2 supplied to the discharge transistor 39-2 between at the time of capturing a still image and at the time of capturing a moving image.

Here, switching of a potential of the overflow gate when a still image and a moving image are captured using the pixel 21 will be described with reference to FIG. 5.

Figure 5:
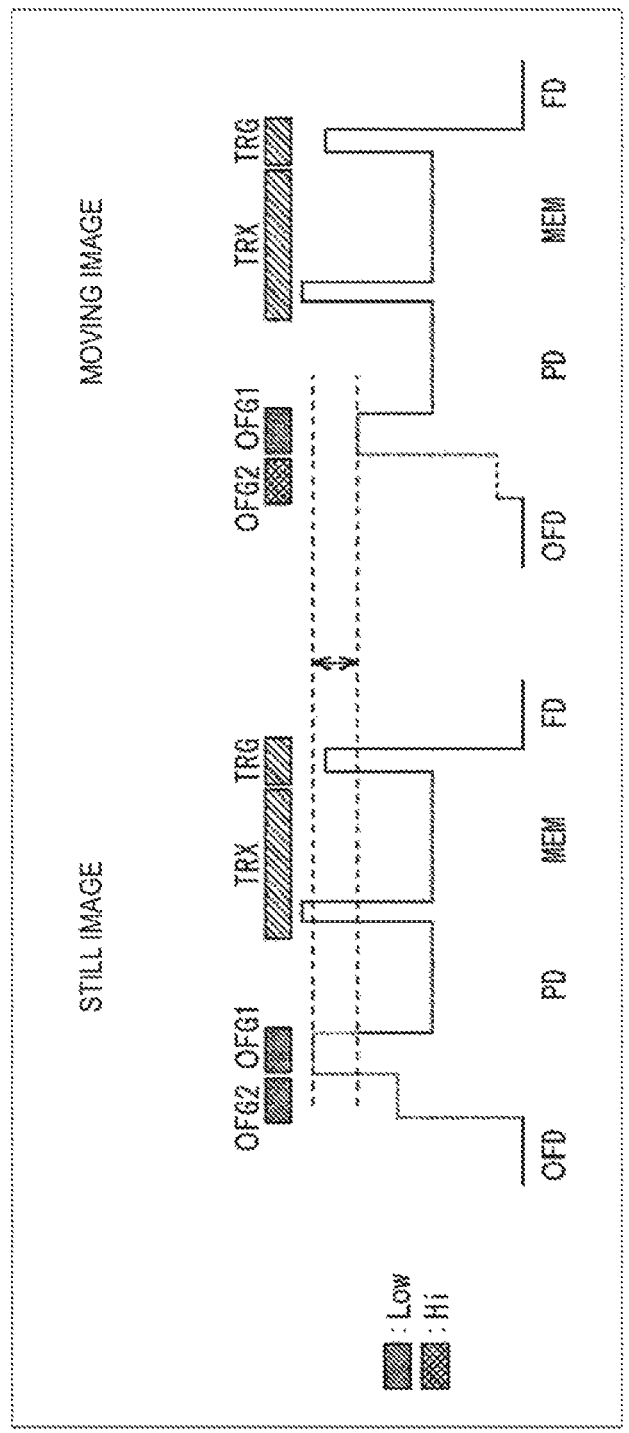
FIG. 5 is an explanatory diagram of switching a potential of an overflow gate.

The left side of FIG. 5 shows a potential of the pixel 21 during capturing of a still image, and the right side of FIG. 5 shows a potential of the pixel 21 during capturing of a moving image.

In the pixel 21, during capturing of a moving image, the discharge signal OFG2 supplied to the discharge transistor 39-2 is always set to Hi level. Therefore, a reset operation for discharging charges remaining in the PD 31 is performed by driving only the discharge transistor 39-1 during capturing of a moving image, and performed by driving both the discharge transistors 39-1 and 39-2 during capturing of a still image.

Further, in the pixel 21, during capturing of a moving image, the discharge signal OFG2 supplied to the discharge transistor 39-2 is set to Hi level, and thus the potential of the overflow gate can be reduced compared to that during capturing of a still image. That is, the discharge signal OFG2 supplied to the discharge transistor 39-2 is set to Hi level to reduce the potential below the discharge transistor 39-2, resulting in a reduction in the potential below the discharge transistor 39-1 due to the modulation.

As such, in the pixel 21, during capturing of a moving image, the discharge signal OFG2 is always set to Hi level to reduce the potential of the overflow gate, in particular, which is lower than the potential of the first transfer transistor 32. On the other hand, in the pixel 21, during capturing of a still image, the discharge signals OFG1 and OFG2 are set to Low level to make the potential of the overflow gate high at the time of exposure of the PD 31.

For example, in a conventional pixel, a potential of the overflow gate for overflowing the charges generated in the PD has been adjusted by changing an electric potential of the overflow drain OFD. In other words, the conventional pixel is configured so that the potential of the overflow gate changes due to the modulation of the electric potential of the overflow drain OFD. However, in such a configuration, it is apprehended that the interface state of the overflow gate ages.

In contrast, the pixel 21 is configured to adjust a potential of the overflow gate by switching the discharge signal OFG2 supplied to the discharge transistor 39-2, without changing the electric potential of the overflow drain OFD. As a result, in the pixel 21, it is possible to suppress aging of the interface state of the overflow gate, and avoid deterioration of reliability. Moreover, the pixel 21 can be avoided from being viewable as a point defect of transfer failure, and deterioration of the image quality can be avoided.

Furthermore, the pixel 21 can be driven by a driving method to prevent charges from being pumped from the overflow drain OFD in a reset operation of the PD 31 performed in starting exposure.

Next, a driving method of the pixel 21 will be described with reference to FIGS. 6 to 10.

Figure 6:
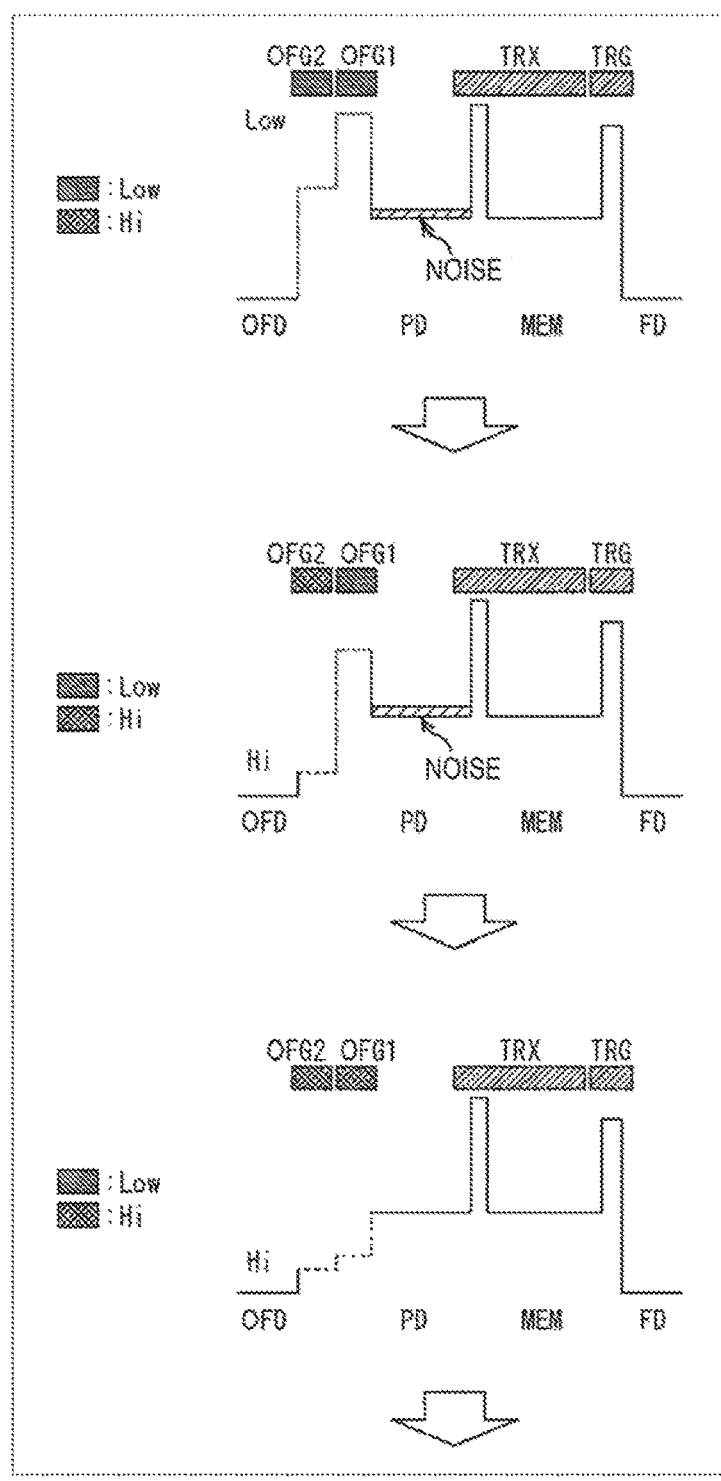
FIG. 6 is an explanatory diagram of a driving method during capturing of a still image.
Figure 7:
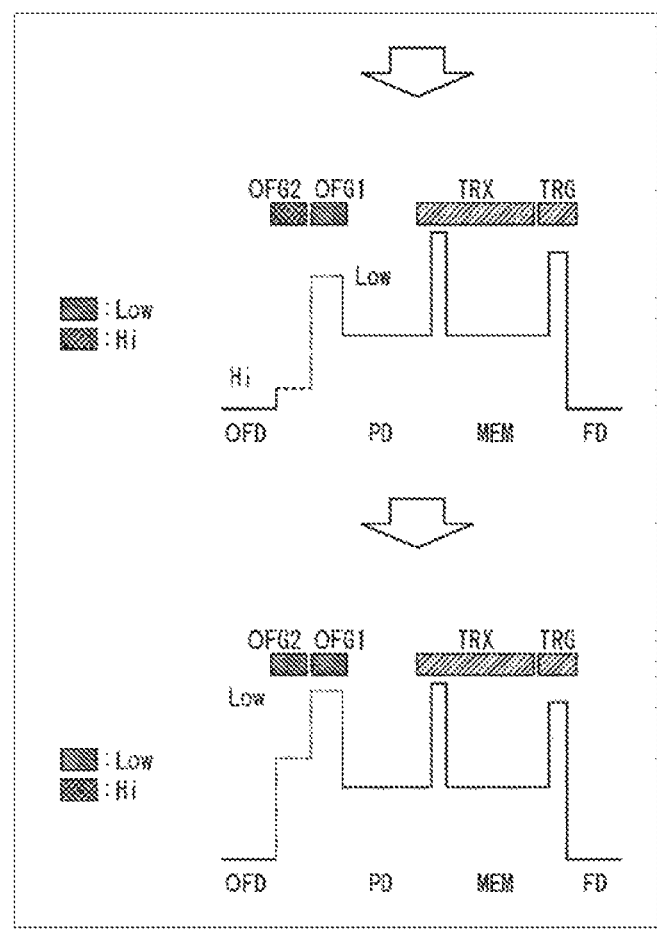
FIG. 7 is an explanatory diagram of a driving method during capturing of a still image.

FIGS. 6 and 7 show the change in the potential when a reset operation of the PD 31 is performed in starting exposure of the pixel 21, during capturing of a still image.

In the pixel 21 prior to starting exposure, as shown in the uppermost stage of FIG. 6, charges which become noise remain in the PD 31. In other words, after the charges generated in the exposure one frame before are transferred from the PD 31 to the memory unit 33 (MEM), charges subjected to photoelectric conversion in the PD 31 are stored. Accordingly, in order to avoid pixel signals from being influenced by the charges, a reset operation of discharging the charges remaining in the PD 31 to the overflow drain OFD is performed when the exposure is started.

Moreover, at the time when the reset operation of the PD 31 is started, the drive signal OFG1 supplied to the discharge transistor 39-1 is Low level, and the drive signal OFG2 supplied to the discharge transistor 39-2 is Low level. As such, when both the drive signal OFG1 and the drive signal OFG2 are Low level, the potential below the discharge transistor 39-1 is set to be slightly lower than the potential below the first transfer transistor 32. Moreover, the potential below the discharge transistor 39-2 is set to be sufficiently lower than the potential below the first transfer transistor 32.

First, in the pixel 21, as shown in the second stage from the top of FIG. 6, only the drive signal OFG2 supplied to the discharge transistor 39-2 on the overflow drain OFD side is switched from Low level to Hi level. As a result, the potential below the discharge transistor 39-2 is equal to or lower than the potential of the PD 31.

Next, in the pixel 21, as shown in the third stage (lowermost stage) from the top of FIG. 6, the drive signal OFG1 supplied to the discharge transistor 39-1 is switched from Low level to Hi level. As a result, the potential of the discharge transistor 39-1 becomes lower than the potential of the PD 31, and the charges stored in the PD 31 are discharged to the overflow drain OFD. That is, in the pixel 21, in a state where both the drive signals OFG1 and OFG2 are Hi level, the respective potentials are set so that the potential of the discharge transistor 39-1 becomes lower than the potential of the PD 31, and the potential of the discharge transistor 39-2 becomes lower than the potential of the discharge transistor 39-1.

Thereafter, as shown in the upper stage of FIG. 7, the drive signal OFG1 supplied to the discharge transistor 39-1 is switched from Hi level to Low level, and the potential of the discharge transistor 39-1 returns to the original potential.

Subsequently, as shown in the lower stage of FIG. 7, the drive signal OFG2 supplied to the discharge transistor 39-2 is switched from Hi level to Low level, and the potential of the discharge transistor 39-2 returns to the original potential. As a result, the reset operation of the PD 31 is terminated, and the exposure of the PD 31 is started.

As such, in the pixel 21, during capturing of a still image, the charges stored in the PD 31 are discharged, and then, driving is performed such that the potential of the discharge transistor 39-1 is first returned to the original potential, and then the potential of the discharge transistor 39-2 is returned to the original potential. As a result, in the pixel 21, it is possible to prevent charges from being pumped from the overflow drain OFD.

For example, in a conventional pixel, when the overflow drain OFD is made to a lower voltage, charges may flow back from the overflow drain OFD to the PD, and due to the charges leaked into the PD, pixel signals may be saturated (become white points). As a result, it is apprehended that the image quality may deteriorate, and thus a stored charge amount of the PD is unlikely to be increased as expected.

In contrast, the pixel 21 is driven by the driving method as described with reference to FIGS. 6 and 7, which prevents charges from flowing back from the overflow drain OFD to the PD 31, and as a result, can avoid the image quality from being deteriorated.

Figure 8:
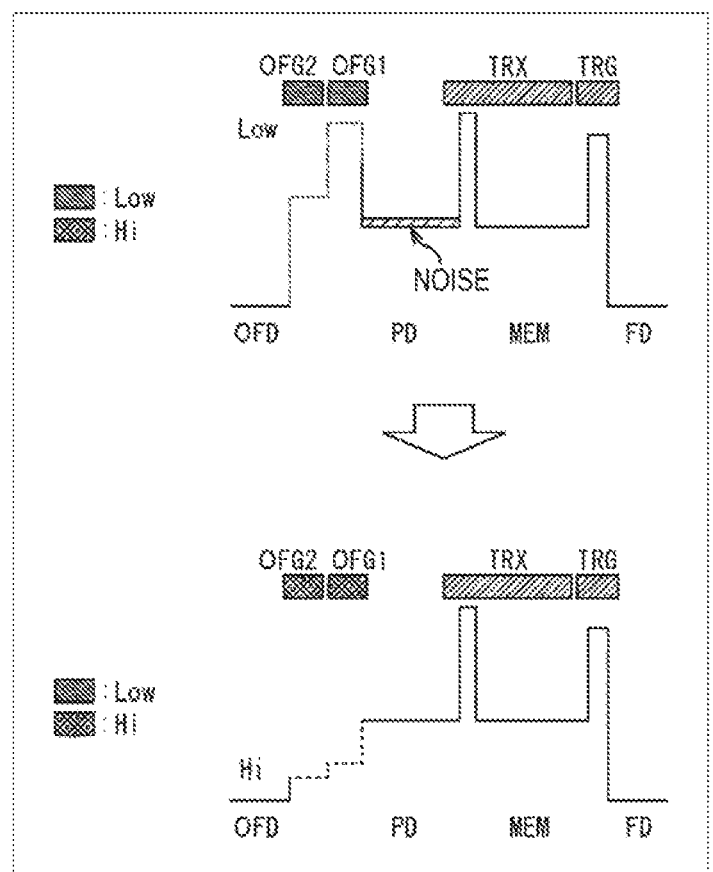
FIG. 8 is an explanatory diagram of another example of a driving method during capturing of a still image.
Figure 9:
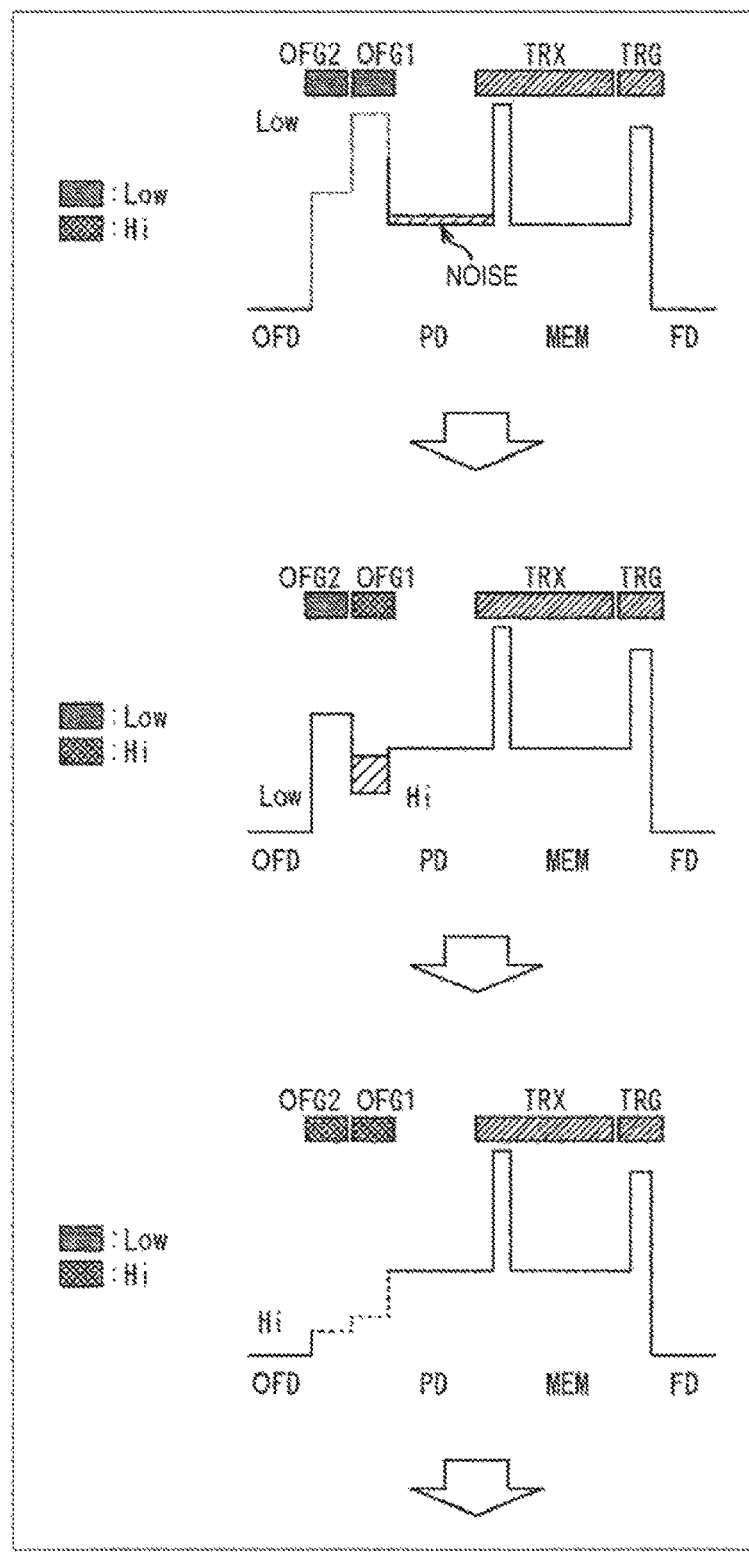
FIG. 9 is an explanatory diagram of still another example of a driving method during capturing of a still image.

Note that, in the operation until the charges remaining in the PD 31 as shown in FIG. 6 are discharged to the overflow drain OFD, for example, as shown in FIG. 8, driving may be performed such that both the drive signals OFG1 and OFG2 are set to Hi level at the same timing. Moreover, for example, as shown in FIG. 9, driving may be performed such that the drive signal OFG1 is set to Hi level first, and then the drive signal OFG2 is set to Hi level.

In other words, in the operation until the charges stored in the PD 31 are discharged to the overflow drain OFD, a timing of setting the drive signal OFG1 to Hi level, and a timing of setting the drive signal OFG2 to Hi level may be in any order.

Figure 10:
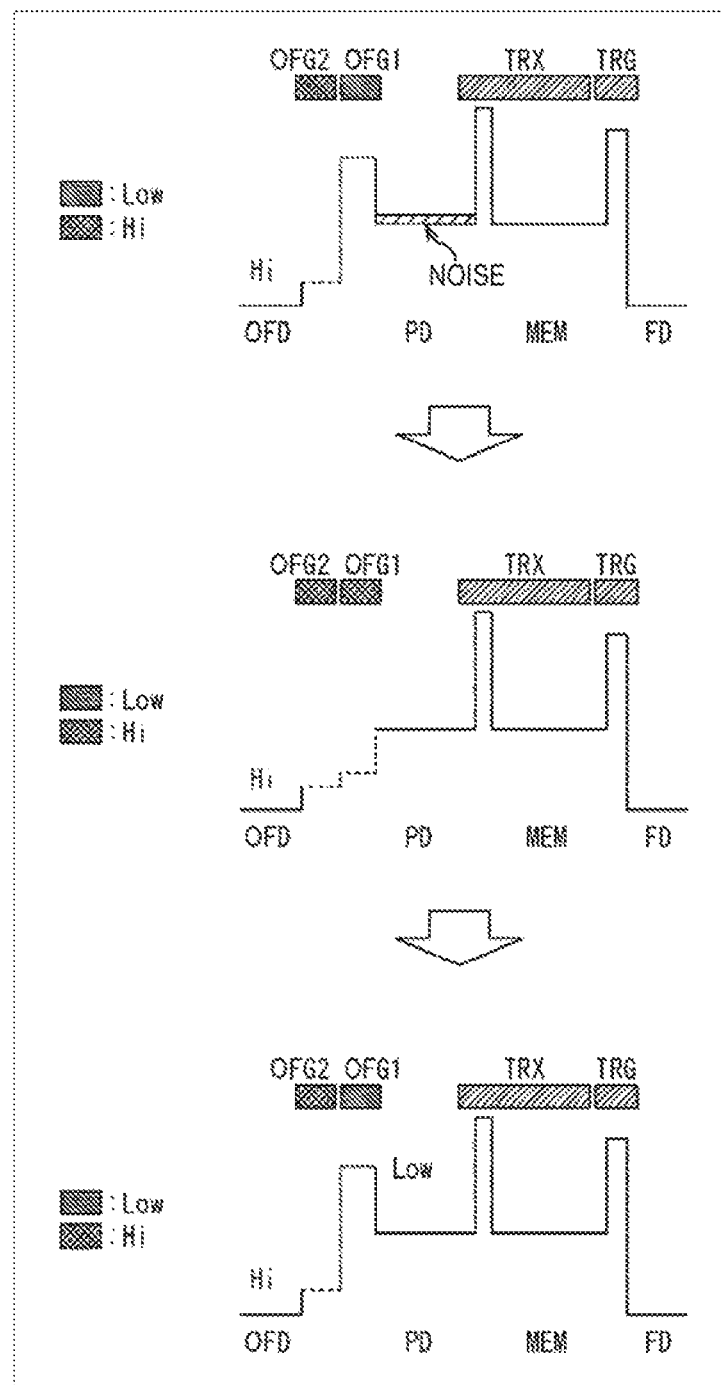
FIG. 10 is an explanatory diagram of a driving method during capturing of a moving image.

Next, FIG. 10 shows the change in the potential in performing a reset operation of the PD 31 when exposure of the pixel 21 is started during capturing of a moving image.

As described above with reference to FIG. 5, in the pixel 21, during capturing of a moving image, the discharge signal OFG2 supplied to the discharge transistor 39-2 is always set to Hi level. Accordingly, the charges stored in the PD 31 can be discharged to the overflow drain OFD only by driving the discharge transistor 39-1.

For example, similar to during capturing of a still image, in the pixel 21 prior to starting exposure, as shown in the uppermost stage of FIG. 10, the charges which become noise remain in the PD 31.

Then, as shown in the second stage from the top of FIG. 10, the drive signal OFG1 supplied to the discharge transistor 39-1 is switched from Low level to Hi level. As a result, the potential of the discharge transistor 39-1 becomes lower than the potential of the PD 31, and the charges stored in the PD 31 are discharged to the overflow drain OFD.

Thereafter, as shown in the third stage (lowermost stage) from the top of FIG. 10, the drive signal OFG1 supplied to the discharge transistor 39-1 is switched from Hi level to Low level, and the potential of the discharge transistor 39-1 returns to the original potential. As a result, the reset operation of the PD 31 is terminated, and exposure of the PD 31 is started.

As such, in the pixel 21, during capturing of a moving image, a reset operation of the PD 31 is performed only by driving the discharge transistor 39-1. Moreover, in the pixel 21, the potential below the discharge transistor 39-2 is set to be higher than that of the overflow drain OFD in a state where the Hi level discharge signal OFG2 is supplied, so that it is possible to prevent the charges from being pumped up from the overflow drain OFD.

Note that, during capturing of a moving image, in the pixel 21, it is necessary to perform setting so that the potential of the PD 31 on the overflow drain OFD side is lower than the potential of the PD 31 on the memory unit 33 side. In contrast, during capturing of a still image, it is not necessary for the pixel 21 to have such a potential relation.

Figure 11A:
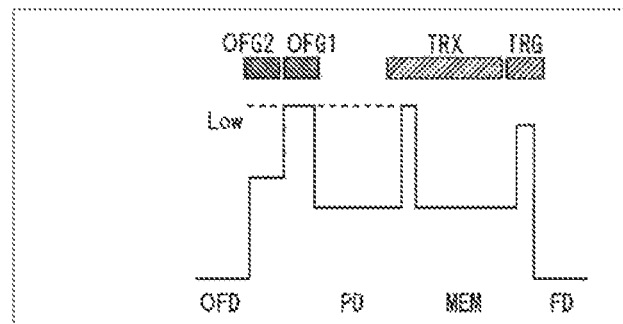
FIGS. 11A, 11B and 11C are explanatory diagrams of a relation of a potential of an overflow gate.
Figure 11B:
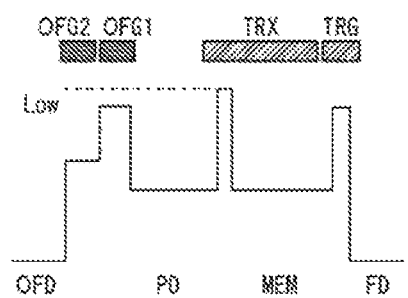

For example, during capturing of a still image, as shown in FIG. 11A, the potential of the PD 31 on the memory unit 33 side and the potential of the PD 31 on the overflow drain OFD side may be substantially the same level. Obviously, as shown in FIG. 11B, the potential of the PD 31 on the overflow drain OFD side may be lower than the potential of the PD 31 on the memory unit 33 side. Moreover, as shown in FIG. 11C, the potential of the PD 31 on the overflow drain OFD side may be higher than the potential of the PD 31 on the memory unit 33 side.

Figure 11C:
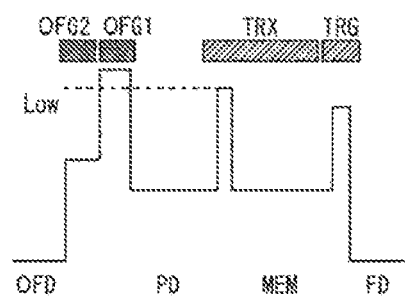

As such, in the pixel 21, during capturing of a still image, as shown in FIGS. 11A, 11B and 11C, the potential of the PD 31 on the overflow drain OFD side may be set to any of the three states.

Next, a method of manufacturing the pixel 21 will be described with reference to FIG. 12.

Figure 12:
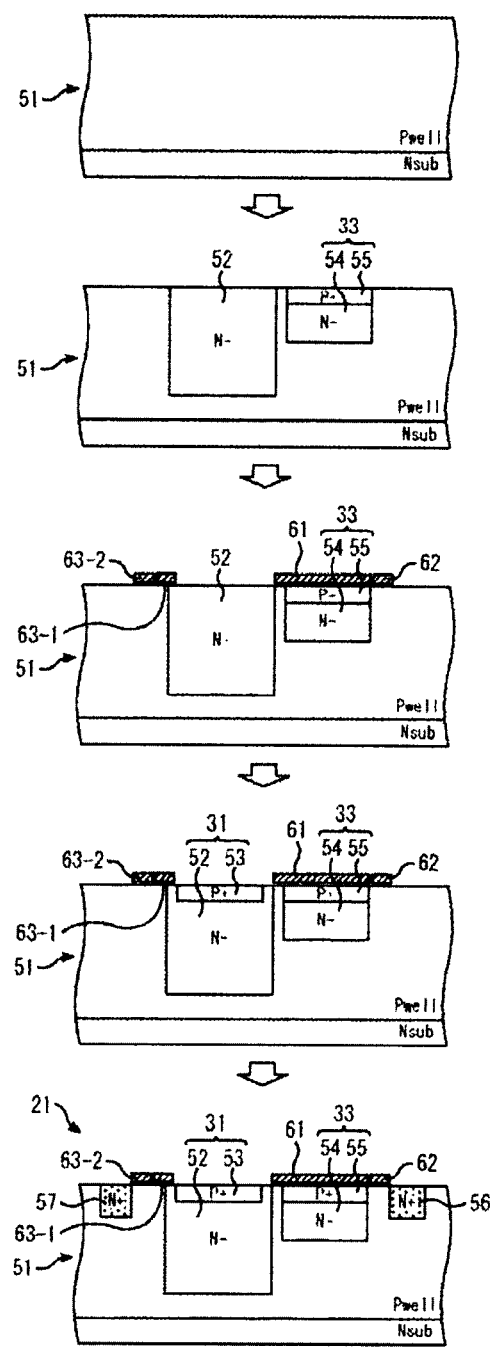
FIG. 12 is an explanatory diagram of a method of manufacturing a pixel.

First, as shown in the uppermost stage of FIG. 12, the N type semiconductor substrate 51 in which a P well is formed is used, and in a first process, the N-type regions 52 and 54 are formed by implanting an N-type impurity, and the P-type region 55 is formed by implanting a P-type impurity. As a result, as shown in the second stage from the top of FIG. 12, the memory unit 33 that includes the N-type region 54 and the P-type region 55 is formed.

Next, in a second process, after a gate insulating film (not shown) is deposited, for example, polysilicon is deposited and etched, and thus the gate electrode 61, the gate electrode 62, the gate electrode 63-1, and the gate electrode 63-2 are laminated, as shown in the third stage from the top of FIG. 12.

Moreover, in a third process, the P-type region 53 is formed by implanting a P-type impurity into the front-surface of the N-type region 52. As a result, as shown in the fourth stage from the top of FIG. 12, the PD 31 (HAD: Hole-Accumulation Diode) is formed by the P-N junction of the N-type region 52 and the P-type region 53.

Then, in the fourth process, the highly-concentrated N-type region 56 and the highly-concentrated N-type region 57 each becoming a diffusion layer are formed by implanting a highly-concentrated N-type impurity, as shown in the fifth stage (lowermost stage) from the top of FIG. 12.

Thereafter, as shown in FIG. 3, wirings are connected to the highly-concentrated N-type region 56 and the highly-concentrated N-type region 57, respectively, and thereby a pixel 21 can be formed. Note that, the semiconductor substrate 51 may be either Nsub or Psub, and the memory unit 33 may be configured to have no P-type region 55.

Next, modifications of a planar configuration of the pixel 21 will be described with reference to FIGS. 13 to 20. Note that, in the following description, the configurations common to the first layout of the pixel 21 shown in FIG. 4 are given the same reference numerals, and a detailed description thereof will be omitted.

Figure 13:
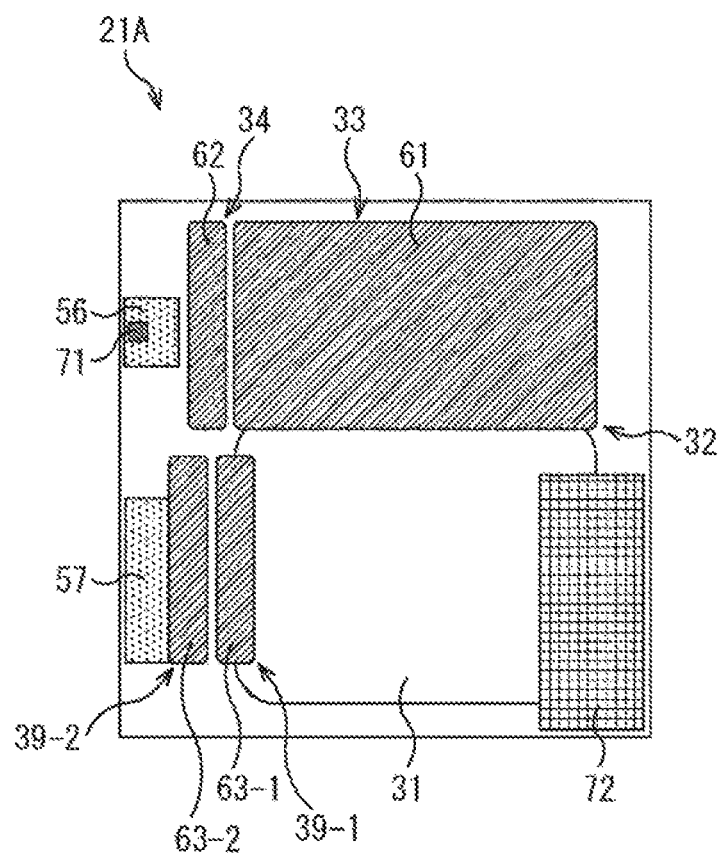
FIG. 13 is a diagram showing a second exemplary layout of a pixel 21.

FIG. 13 shows a second exemplary layout of the pixel 21.

In a pixel 21A shown in FIG. 13, similarly to the pixel 21 of FIG. 4, the PD 31 is arranged on the lower side, the memory unit 33 is arranged on the upper side, and, the highly-concentrated N-type region 56 is arranged on the left side of FIG. 13 with respect to the memory unit 33, via the second transfer transistor 34.

Further, in the pixel 21A, the highly-concentrated N-type region 57 is arranged on the left side of FIG. 13 with respect to the PD 31, via the discharge transistors 39-1 and 39-2, and the pixel transistor region 72 is arranged on the opposite side thereof. That is, in the pixel 21A, the discharge transistors 39-1 and 39-2 are arranged for the PD 31 on the same side where the second transfer transistor 34 is arranged for the memory unit 33.

As such, the pixel 21A has a layout in which the arrangement of the discharge transistors 39-1 and 39-2 for the PD 31 is different from that of the pixel 21 of FIG. 4. Moreover, also in the pixel 21A, similar to the pixel 21 of FIG. 4, the discharge transistors 39-1 and 39-2 do not need to be arranged adjacent to the memory unit 33.

Figure 14:
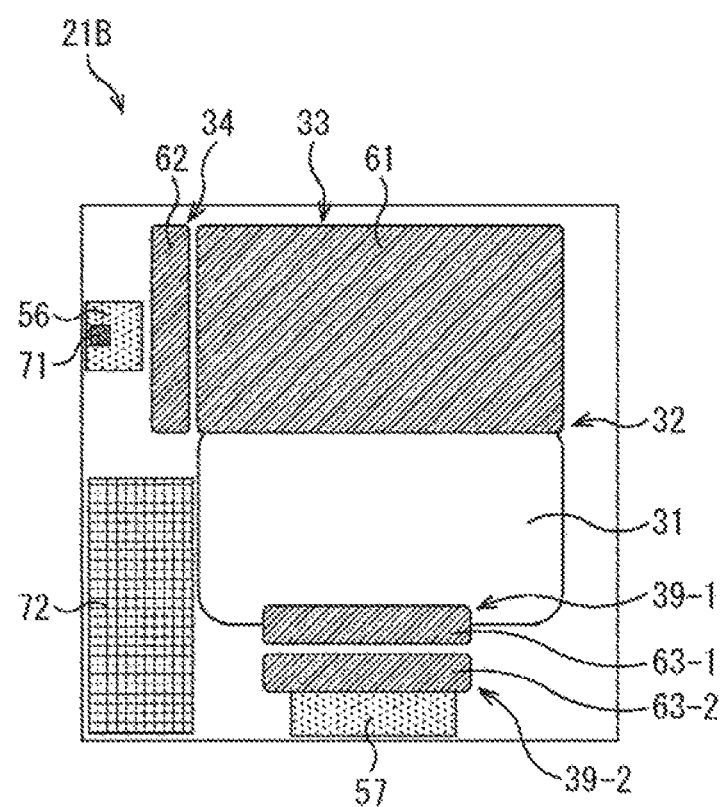
FIG. 14 is a diagram showing a third exemplary layout of a pixel 21.

FIG. 14 shows a third exemplary layout of the pixel 21.

In a pixel 21B shown in FIG. 14, similarly to the pixel 21 of FIG. 4, the PD 31 is arranged on the lower side, the memory unit 33 is arranged on the upper side, and, the highly-concentrated N-type region 56 is arranged on the left side of FIG. 13 with respect to the memory unit 33, via the second transfer transistor 34.

Further, in the pixel 21B, the highly-concentrated N-type region 57 is arranged on the lower side of FIG. 14 with respect to the PD 31, via the discharge transistors 39-1 and 39-2, and the pixel transistor region 72 is arranged on the left side with respect to the PD 31. That is, the pixel 21B has a layout in which the discharge transistors 39-1 and 39-2 are arranged on the opposite side to the side where the memory unit 33 is arranged with respect to the PD 31.

As such, the pixel 21B has a layout in which the arrangement of the discharge transistors 39-1 and 39-2 for the PD 31 is different from that of the pixel 21 of FIG. 4. Moreover, also in the pixel 21B, similar to the pixel 21 of FIG. 4, the discharge transistors 39-1 and 39-2 do not need to be arranged adjacent to the memory unit 33.

Figure 15:
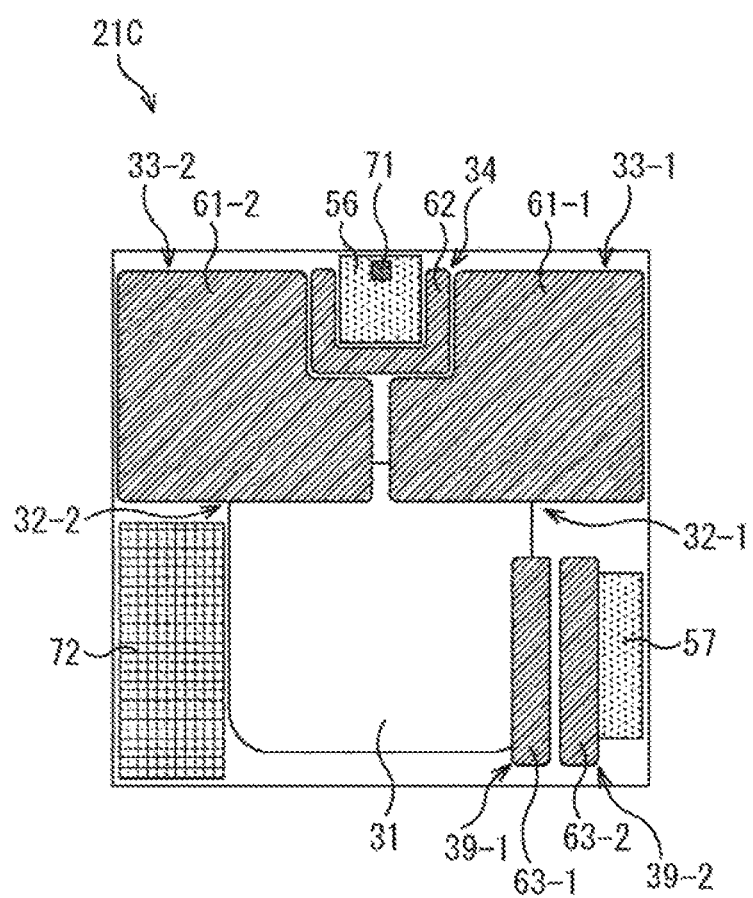
FIG. 15 is a diagram showing a fourth exemplary layout of a pixel 21.

FIG. 15 shows a fourth exemplary layout of the pixel 21.

In a pixel 21C shown in FIG. 15, similar to the pixel 21 of FIG. 4, the PD 31 is arranged on the lower side, the highly-concentrated N-type region 57 is arranged on the right side of FIG. 15 with respect to the PD 31, via the discharge transistors 39-1 and 39-2, and the pixel transistor region 72 is arranged on the left side of FIG. 15.

Further, the pixel 21C has a layout different from that of the pixel 21 of FIG. 4 in that there are two memory units 33-1 and 33-2, and the highly-concentrated N-type region 56 is arranged on the upper side of the memory units 33-1 and 33-2, via the second transfer transistor 34.

As such, the pixel 21C can employ the configuration in which two memory units 33-1 and 33-2 are arranged for one PD 31. In other words, the number of the memory units 33 is not limited to one, but the plurality of memory units 33 may be arranged.

Figure 16:
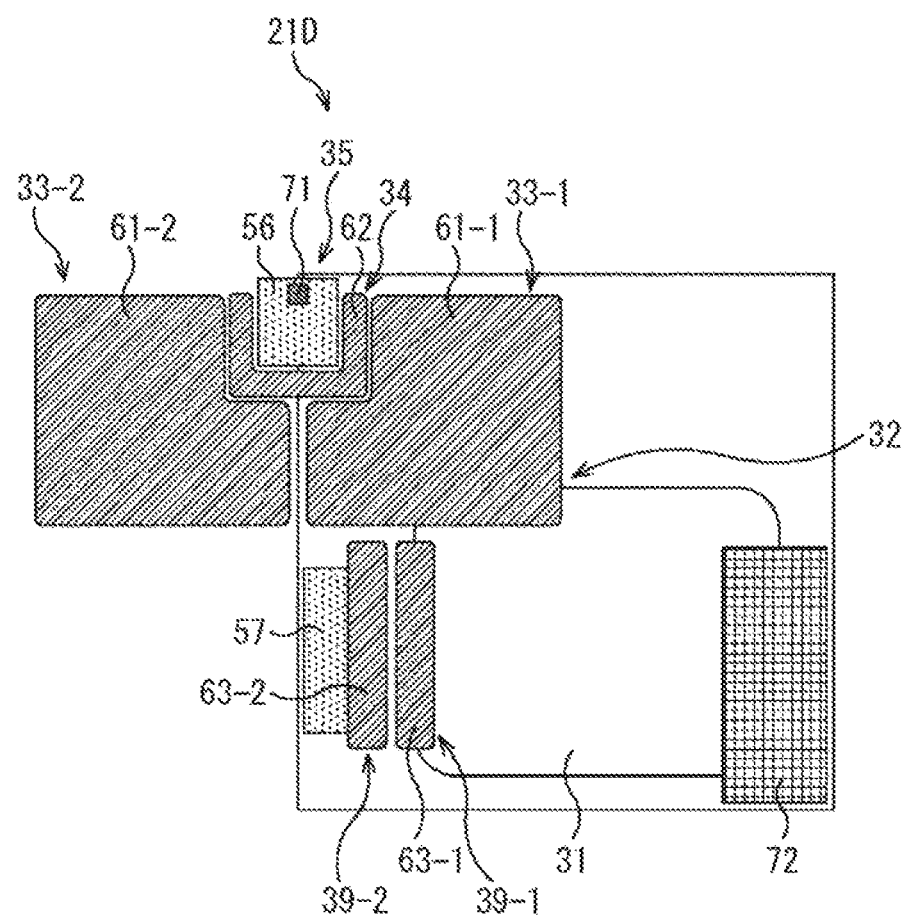
FIG. 16 is a diagram showing a fifth exemplary layout of a pixel 21.

FIG. 16 shows a fifth exemplary layout of the pixel 21.

In a pixel 21D shown in FIG. 16, similar to the pixel 21 of FIG. 4, the PD 31 is arranged on the lower side, the highly-concentrated N-type region 57 is arranged on the right side of FIG. 16 with respect to the PD 31, via the discharge transistors 39-1 and 39-2, and the pixel transistor region 72 is arranged on the left side of FIG. 16.

Further, the pixel 21D has a configuration in which two memory units 33-1 and 33-2 are provided via the second transfer transistor 34 for one highly-concentrated N-type region 56, and has a layout to share the FD unit 35 with the adjacent pixel 21D (not shown).

In other words, the pixel 21D transfers charges to the memory unit 33-1, and a pixel signal is read out via the FD unit 35, while the pixel 21D adjacent on the left side (not shown) transfers charges to the memory unit 33-2, and a pixel signal is read out via the FD unit 35 which is shared with the pixel 21D.

As such, the pixel 21D can employ the configuration in which the adjacent pixels 21D share the FD unit 35.

Figure 17:
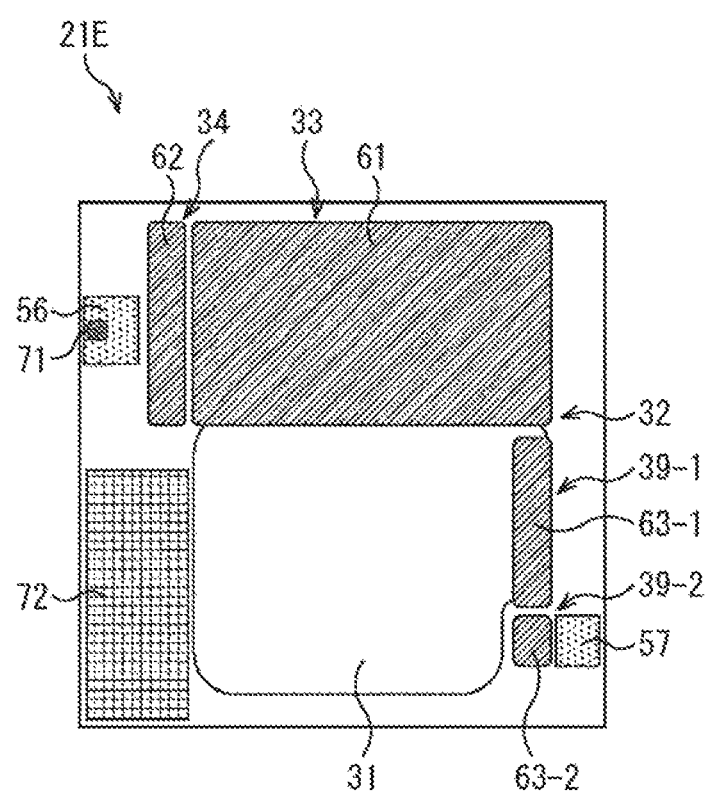
FIG. 17 is a diagram showing a sixth exemplary layout of a pixel 21.

FIG. 17 shows a sixth exemplary layout of the pixel 21.

In a pixel 21E shown in FIG. 17, similar to the pixel 21 of FIG. 4, the PD 31 is arranged on the lower side, and the memory unit 33 is arranged on the upper side. Moreover, the highly-concentrated N-type region 56 is arranged on the left side of FIG. 17 with respect to the memory unit 33, via the second transfer transistor 34, and the pixel transistor region 72 is arranged on the left side of FIG. 17 with respect to the PD 31.

Further, in the pixel 21E, the discharge transistors 39-1 and 39-2 provided in series on the vertical direction are arranged on the right side of FIG. 17 with respect to the PD 31. In other words, the pixel 21E is configured differently in that the discharge transistors 39-1 and 39-2 are arranged in series in the horizontal direction in the pixel 21 of FIG. 4.

As such, the discharge transistors 39-1 and 39-2 may be arranged in any manner in the vertical direction or the horizontal direction, and need to be arranged in series between the PD 31 and the highly-concentrated N-type region 57.

Figure 18:
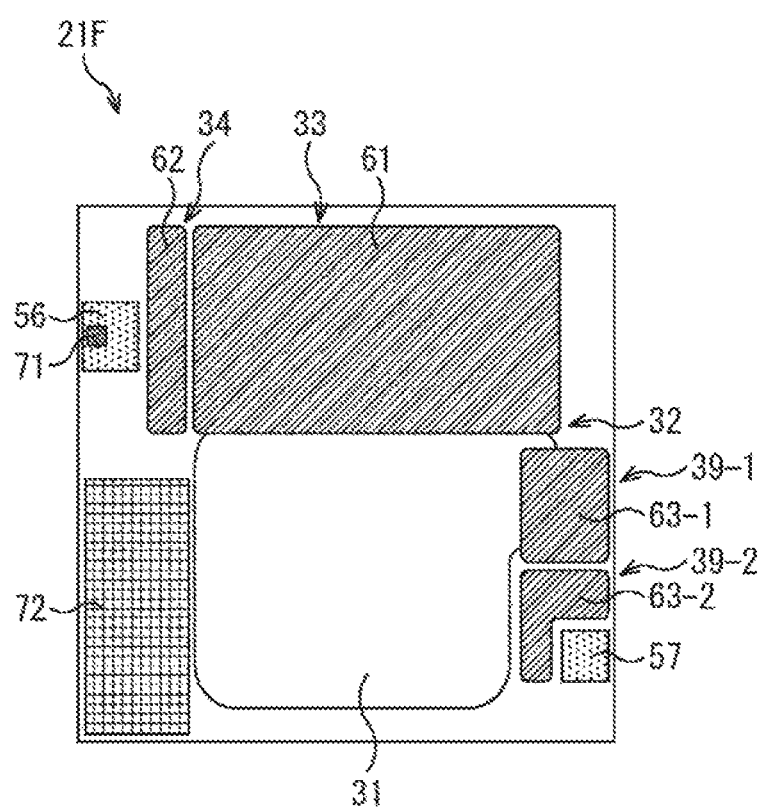
FIG. 18 is a diagram showing a seventh exemplary layout of a pixel 21.

FIG. 18 shows a seventh exemplary layout of the pixel 21.

In a pixel 21F shown in FIG. 18, similar to the pixel 21 of FIG. 4, the PD 31 is arranged on the lower side, and the memory unit 33 is arranged on the upper side. Moreover, the highly-concentrated N-type region 56 is arranged on the left side of FIG. 18 with respect to the memory unit 33, via the second transfer transistor 34, and the pixel transistor region 72 is arranged on the left side of FIG. 18 with respect to the PD 31.

Further, in the pixel 21F, the discharge transistors 39-1 and 39-2 provided in series in the vertical direction are arranged on the right side of FIG. 18 with respect to the PD 31, similar to the pixel 21E of FIG. 17. Furthermore, in the pixel 21F, the discharge transistor 39-2 is formed to surround the PD 31 side and the discharge transistor 39-1 side of the highly-concentrated N-type region 57.

As such, the discharge transistors 39-1 and 39-2 may be arranged in any manner in the vertical direction or the horizontal direction, and need to be arranged in series between the PD 31 and the highly-concentrated N-type region 57. Moreover, the shape of the discharge transistor 39-2 is also not limited to a rectangle.

Figure 19:
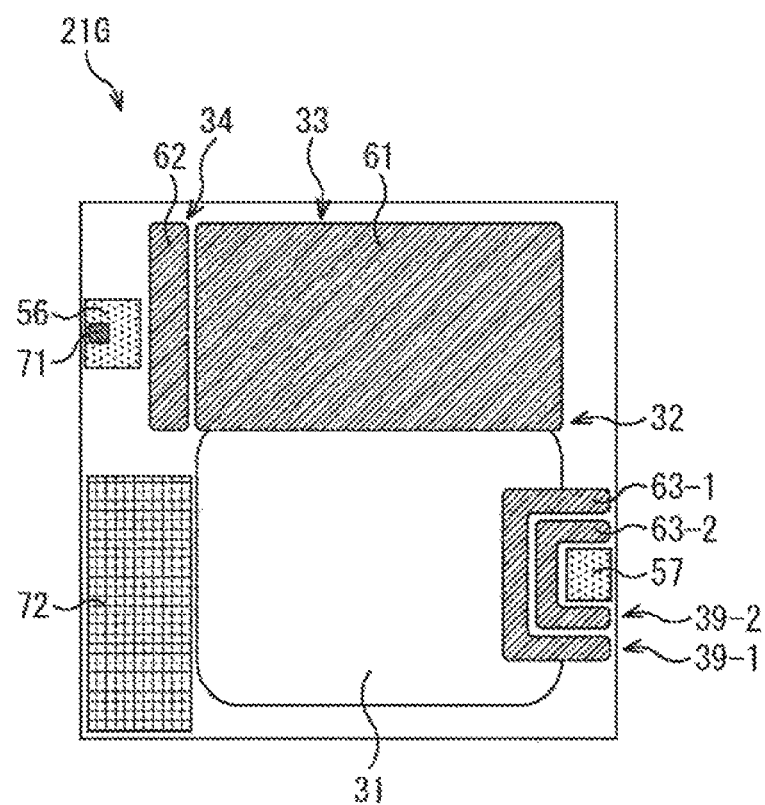
FIG. 19 is a diagram showing an eighth exemplary layout of a pixel 21.

FIG. 19 shows an eighth exemplary layout of the pixel 21.

In a pixel 21G shown in FIG. 19, similar to the pixel 21 of FIG. 4, the PD 31 is arranged on the lower side, and the memory unit 33 is arranged on the upper side. Moreover, in the pixel 21G, the highly-concentrated N-type region 56 is arranged on the left side of FIG. 19 with respect to the memory unit 33, via the second transfer transistor 34, and the pixel transistor region 72 is arranged on the left side of FIG. 19 with respect to the PD 31.

Further, in the pixel 21G, the discharge transistors 39-1 and 39-2 which are not rectilinear in shape are arranged on the right side of FIG. 19 with respect to the PD 31. In other words, the pixel 21G has a layout in which the shape of the discharge transistors 39-1 and 39-2 is different from that of the pixel 21 of FIG. 4.

As such, the discharge transistors 39-1 and 39-2 arranged between the PD 31 and the highly-concentrated N-type region 57 may have a shape to surround three sides on the PD 31 side of the highly-concentrated N-type region 57. In other words, in the pixel 21G, as long as the discharge transistors 39-1 and 39-2 can be arranged in series between the PD 31 and the highly-concentrated N-type region 57, the discharge transistors 39-1 and 39-2 having a variety of shapes other than a rectilinear shape can be employed.

Figure 20:
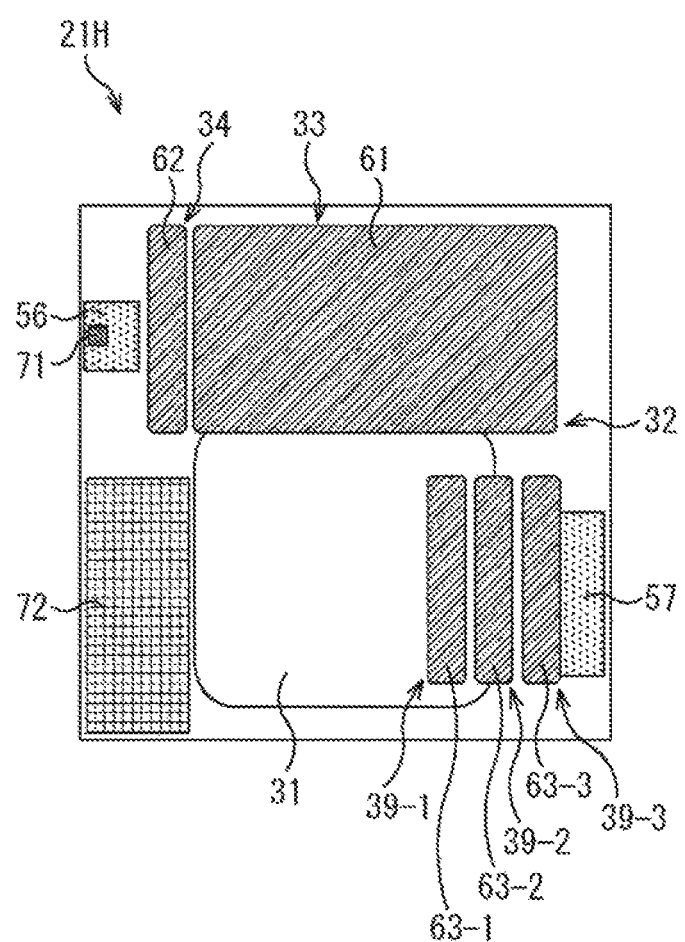
FIG. 20 is a diagram showing a ninth exemplary layout of a pixel 21.

FIG. 20 shows a ninth exemplary layout of the pixel 21.

In a pixel 21H shown in FIG. 20, similar to the pixel 21 of FIG. 4, the PD 31 is arranged on the lower side, and the memory unit 33 is arranged on the upper side. Moreover, the highly-concentrated N-type region 56 is arranged on the left side of FIG. 20 with respect to the memory unit 33, via the second transfer transistor 34, and the pixel transistor region 72 is arranged on the left side of FIG. 20 with respect to the PD 31.

Further, in the pixel 21H, the highly-concentrated N-type region 57 is arranged on the right side of FIG. 20 with respect to the PD 31, via the discharge transistors 39-1 to 39-3. In other words, the pixel 21H has a configuration different from that of the pixel 21 of FIG. 4 in that the pixel 21H includes three discharge transistors 39-1 to 39-3.

As such, the pixel 21 is not limited to a configuration in which two discharge transistors 39-1 and 39-2 are arranged between the PD 31 and the highly-concentrated N-type region 57, similar to the pixel 21 of FIG. 4, and can employ a configuration in which three discharge transistors 39-1 to 39-3 are arranged. Obviously, a configuration in which three or more discharge transistors 39 are arranged in series may be employed.

Figure 21:
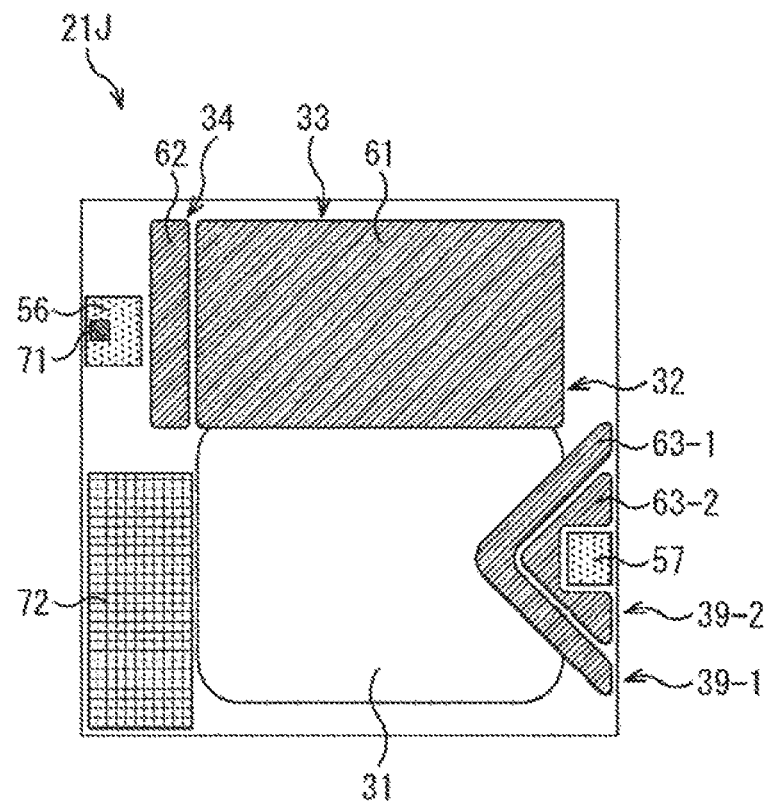
FIG. 21 is a diagram showing a tenth exemplary layout of a pixel 21.

FIG. 21 shows a tenth exemplary layout of the pixel 21.

In a pixel 21J shown in FIG. 21, similar to the pixel 21 of FIG. 4, the PD 31 is arranged on the lower side, and the memory unit 33 is arranged on the upper side. Moreover, the highly-concentrated N-type region 56 is arranged on the left side of FIG. 21 with respect to the memory unit 33, via the second transfer transistor 34, and the pixel transistor region 72 is arranged on the left side of FIG. 21 with respect to the PD 31.

Further, in the pixel 21J, the discharge transistors 39-1 and 39-2 which are not rectilinear in shape are arranged on the right side of FIG. 21 with respect to the PD 31. In other words, the pixel 21J has a layout in which the shape of the discharge transistors 39-1 and 39-2 is different from that of the pixel 21 of FIG. 4.

As such, the discharge transistor 39-2 arranged between the PD 31 and the highly-concentrated N-type region 57 may have a substantially triangle shape such that the center thereof protrudes toward the PD 31 side so as to surround the highly-concentrated N-type region 57. Furthermore, the discharge transistor 39-1 may have a bent shape along the two sides of the PD 31 of the discharge transistor 39-2. In other words, in the pixel 21J, as long as the discharge transistors 39-1 and 39-2 can be arranged in series between the PD 31 and the highly-concentrated N-type region 57, the discharge transistors 39-1 and 39-2 having a variety of shapes other than a rectilinear shape can be employed.

Note that, in the pixel 21, the voltage for driving the discharge transistors 39-1 and 39-2 is not limited to two values of Hi level and Low level and can be set to an arbitrary level of voltages.

Note that the image capture element 11 of the embodiment as described above can be used for various electronic devices, such as imaging systems, such as digital still cameras or digital video cameras, mobile phones having an imaging function, or other devices having an imaging function, for example.

Figure 22:
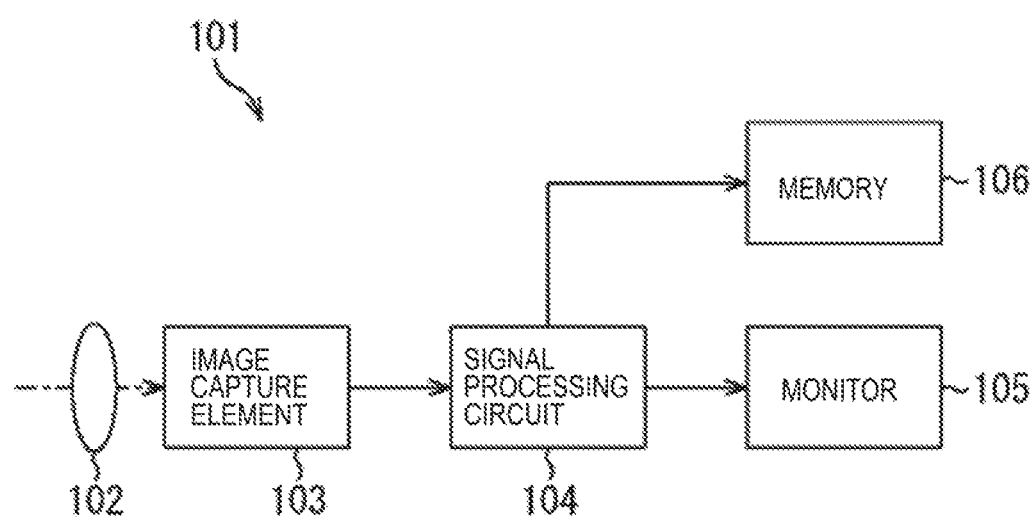
FIG. 22 is a block diagram showing a configuration example of an embodiment of an imaging device to which the present technology is applied.

FIG. 22 is a block diagram showing a configuration example of an imaging device mounted on an electronic device.

As shown in FIG. 22, an imaging device 101 includes an optical system 102, an image capture element 103, a signal processing circuit 104, a monitor 105, and a memory 106, and can capture still images and moving images.

The optical system 102 is configured to have one or a plurality of lenses, and guides image light from a subject (incident light) to the image capture element 103 and forms an image on the light receiving surface (sensor unit) of the image capture element 103.

As the image capture element 103, the image capture element 11 of the aforementioned embodiment is used. Electrons are stored in the image capture element 103 for a certain period in accordance with the image formed on the light receiving surface via the optical system 102. Then, a signal corresponding to electrons stored in the image capture element 103 is supplied to the signal processing circuit 104.

The signal processing circuit 104 performs various kinds of signal processing on the pixel signal output from the image capture element 103. The image (image data) obtained by the signal processing performed by the signal processing circuit 104 is supplied to and displayed on the monitor 105, or is supplied to and stored (recorded) in the memory 106.

In the imaging device 101 thus configured, it is possible to avoid adverse effects caused by, for example, changing an electric potential of the overflow drain OFD, and capture a higher-quality image by using the image capture element 11 of each embodiment described above.

Figure 23:
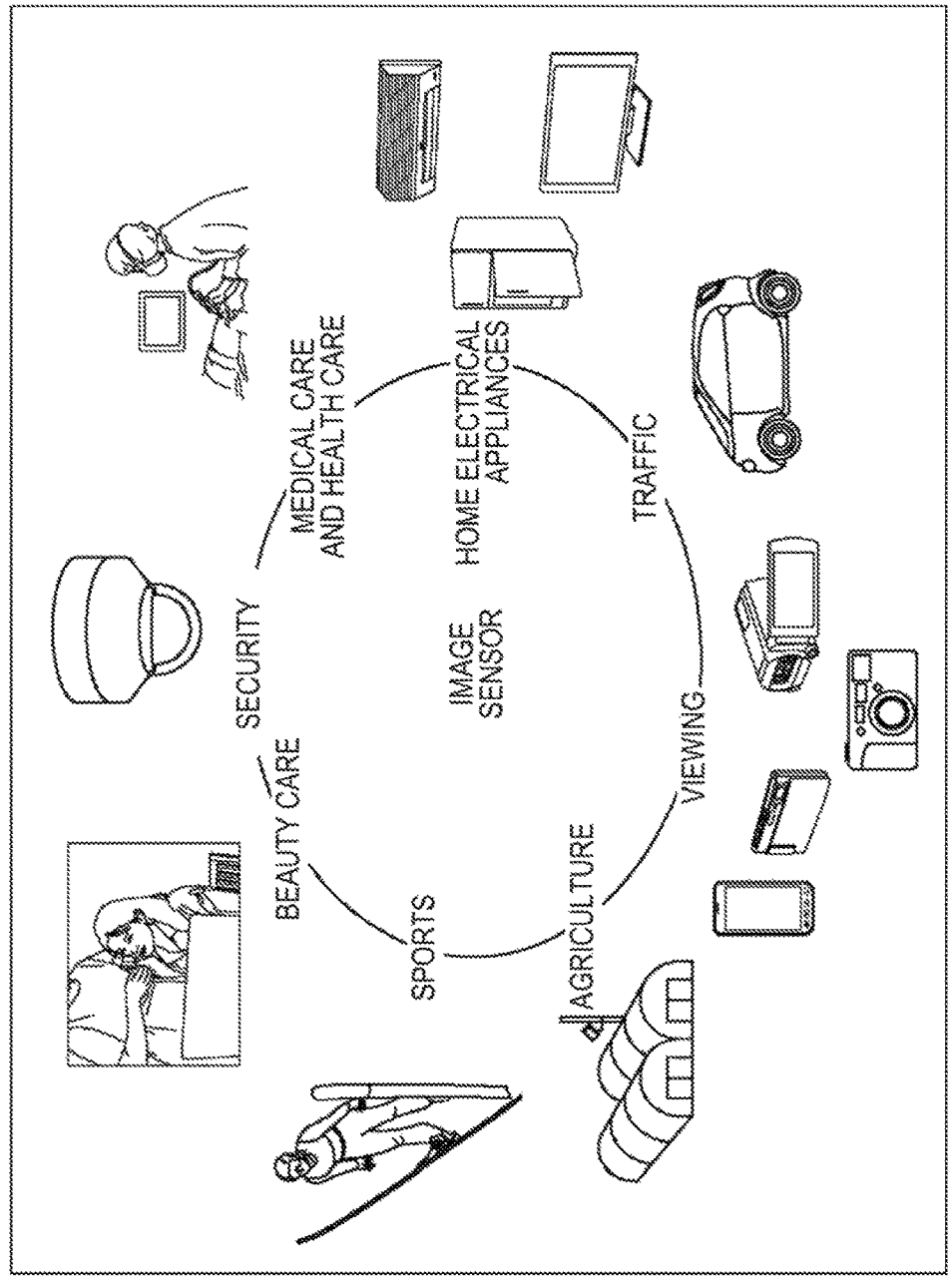
FIG. 23 is a diagram showing a usage example of using an image sensor.

FIG. 23 is a diagram showing a usage example of using the aforementioned image capture element 11 (image sensor).

The image sensor described above can be used in a variety of cases, e.g., sensing light such as visible light, infrared light, ultraviolet light, and X-ray.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

Additionally, the present technology may also be configured as below.

(1)
A solid-state image capture element including a plurality of pixels each including:
a photoelectric conversion unit configured to convert incident light into a charge by photoelectric conversion and store the charge;
a discharge unit configured to discharge a charge remaining in the photoelectric conversion unit; and
a discharge driving unit configured to be driven when a charge is discharged from the photoelectric conversion unit to the discharge unit,
in which at least two or more of the discharge driving units are arranged in series between the photoelectric conversion unit and the discharge unit.

(2)
The solid-state image capture element according to (1),
in which during capturing of a still image, when a reset operation of the photoelectric conversion unit is performed in starting exposure of the pixel, driving is performed such that after potentials of all the discharge driving units arranged in series are reduced and the charge remaining in the photoelectric conversion unit is discharged to the discharge unit, the potential of the discharge driving unit on the photoelectric conversion unit side is returned to an original potential first, and then the potential of another discharge driving unit is returned to an original potential.

(3)
The solid-state image capture element according to (1) or (2),
in which when the reset operation of the photoelectric conversion unit is performed, driving to reduce the potentials is performed sequentially from the discharge driving unit on the discharge unit side among the plurality of discharge driving units arranged in series, so as to discharge the charge remaining in the photoelectric conversion unit to the discharge unit.

(4)
The solid-state image capture element according to any one of (1) to (3),
in which during capturing of a moving image, driving is performed in a state where the potential of the discharge driving unit on the discharge unit side among the plurality of discharge driving units arranged in series is always kept reduced.

(5)
The solid-state image capture element according to any one of (1) to (4),
in which due to modulation caused by bringing about a state in which the potential of the discharge driving unit on the discharge unit side is reduced, the potential of another discharge driving unit adjacent to the discharge driving unit is reduced.

(6)
The solid-state image capture element according to any one of (1) to (5), further including:
a transfer drive element configured to transfer a charge generated in the photoelectric conversion unit to a memory unit,
in which during capturing of a moving image, a potential on the discharge driving unit side with respect to the photoelectric conversion unit is set lower than a potential on the transfer drive element side.

(7)
A driving method of a solid-state image capture element, the solid-state image capture element including a plurality of pixels each including
a photoelectric conversion unit configured to convert incident light into a charge by photoelectric conversion and store the charge,
a discharge unit configured to discharge a charge remaining in the photoelectric conversion unit, and
a discharge driving unit configured to be driven when a charge is discharged from the photoelectric conversion unit to the discharge unit,
in which at least two or more of the discharge driving units are arranged in series between the photoelectric conversion unit and the discharge unit,
the driving method including:
during capturing of a still image, when a reset operation of the photoelectric conversion unit is performed in starting exposure of the pixel, performing driving such that after potentials of all the discharge driving units arranged in series are reduced and the charge remaining in the photoelectric conversion unit is discharged to the discharge unit, the potential of the discharge driving unit on the photoelectric conversion unit side is returned to an original potential first, and then the potential of another discharge driving unit is returned to an original potential.

(8)
An electronic device including:
a solid-state image capture element including a plurality of pixels each including
a photoelectric conversion unit configured to convert incident light into a charge by photoelectric conversion and store the charge,
a discharge unit configured to discharge a charge remaining in the photoelectric conversion unit, and
a discharge driving unit configured to be driven when a charge is discharged from the photoelectric conversion unit to the discharge unit,
in which at least two or more of the discharge driving units are arranged in series between the photoelectric conversion unit and the discharge unit.

Note that, the present embodiment is not limited to the aforementioned embodiment and various changes can be made without departing from the gist of the present disclosure.

REFERENCE SIGNS LIST 11 image capture element
12 pixel region
13 vertical drive circuit
14 column signal processing circuit
15 horizontal drive circuit
16 output circuit
17 control circuit
21 pixel
22 horizontal signal line
23 vertical signal line
24 data output signal line
31 PD
32 first transfer transistor
33 memory unit
34 second transfer transistor
35 FD unit
36 amplification transistor
37 select transistor
38 reset transistor
39-1 and 39-2 discharge transistor
51 semiconductor substrate
52 N-type region
53 P-type region 54 N-type region
55 P-type region
56 and 57 highly-concentrated N-type region
61, 62, 63-1, and 63-2 gate electrode
71 wiring
72 pixel transistor region

The invention claimed is:

1. A solid-state image capture element, comprising:
a plurality of pixels, wherein each pixel of the plurality of pixels comprises:
a photoelectric conversion unit configured to:
convert incident light into a charge by photoelectric conversion; and
store the charge;
a discharge unit configured to discharge the charge remaining in the photoelectric conversion unit; and
a discharge driving unit configured to be driven based on the discharge of the charge from the photoelectric conversion unit to the discharge unit,
wherein a plurality of discharge driving units are arranged in series between the photoelectric conversion unit and the discharge unit, and
wherein during capture of a still image and based on a reset operation of the photoelectric conversion unit performed at a start of exposure of a pixel of the plurality of pixels, driving is performed such that:
after potentials of all the plurality of discharge driving units arranged in series are reduced and the charge remaining in the photoelectric conversion unit is discharged to the discharge unit,
a potential of a first discharge driving unit on the photoelectric conversion unit side among the plurality of discharge driving units arranged in series is returned to an original potential first, and
a potential of a second discharge driving unit among the plurality of discharge driving units arranged in series is returned to the original potential.

2. The solid-state image capture element according to claim 1, wherein based on the reset operation of the photoelectric conversion unit, the driving to reduce the after potentials is performed sequentially from a third discharge driving unit on the discharge unit side among the plurality of discharge driving units arranged in series to discharge the charge remaining in the photoelectric conversion unit to the discharge unit.

3. The solid-state image capture element according to claim 1, wherein during capture of a moving image, the driving is performed in a state where a potential of a third discharge driving unit on the discharge unit side among the plurality of discharge driving units arranged in series is always kept reduced.

4. The solid-state image capture element according to claim 3, wherein based on modulation caused by the state in which the potential of the third discharge driving unit on the discharge unit side is reduced, a potential of a fourth discharge driving unit adjacent to the third discharge driving unit among the plurality of discharge driving units arranged in series is reduced.

5. The solid-state image capture element according to claim 3, further comprising
a transfer drive element configured to transfer the charge generated in the photoelectric conversion unit to a memory unit,
wherein during capture of the moving image, a first potential on the discharge driving unit side with respect to the photoelectric conversion unit is set lower than a second potential on the transfer drive element side.

6. A driving method of a solid-state image capture element, the driving method comprising:
during capturing of a still image and based on a reset operation of a photoelectric conversion unit of a pixel of the solid-state image capture element in starting exposure of the pixel, performing driving such that:
after potentials of a plurality of discharge driving units arranged in series are reduced and a charge remaining in the photoelectric conversion unit is discharged to a discharge unit,
wherein the photoelectric conversion unit is configured to convert incident light into the charge by photoelectric conversion and store the charge,
wherein the plurality of discharge driving units are arranged in series between the photoelectric conversion unit and the discharge unit, and
wherein each discharge driving unit of the plurality of discharge driving units is configured to be driven based on discharge of the charge from the photoelectric conversion unit to the discharge unit,
a potential of a first discharge driving unit on the photoelectric conversion unit side among the plurality of discharge driving units arranged in series is returned to an original potential, and
a potential of a second discharge driving unit among the plurality of discharge driving units arranged in series is returned to the original potential.

7. An electronic device, comprising:
a solid-state image capture element including a plurality of pixels,
wherein each pixel of the plurality of pixels comprises:
a photoelectric conversion unit configured to:
convert incident light into a charge by photoelectric conversions; and
store the charge;
a discharge unit configured to discharge the charge remaining in the photoelectric conversion unit; and
a discharge driving unit configured to be driven based on the discharge of the charge from the photoelectric conversion unit to the discharge unit,
wherein a plurality of discharge driving units are arranged in series between the photoelectric conversion unit and the discharge unit, and
wherein during capture of a still image and based on a reset operation of the photoelectric conversion unit performed in starting exposure of a pixel of the plurality of pixels, driving is performed such that:
after potentials of all the plurality of discharge driving units arranged in series are reduced and the charge remaining in the photoelectric conversion unit is discharged to the discharge unit,
a potential of a first discharge driving unit on the photoelectric conversion unit side among the plurality of discharge driving units arranged in series is returned to an original potential first, and
a potential of a second discharge driving unit among the plurality of discharge driving units arranged in series is returned to the original potential.

8. A solid-state image capture element comprising:
a plurality of pixels, wherein each pixel of the plurality of pixels comprises:
a photoelectric conversion unit configured to:
convert incident light into a charge by photoelectric conversion; and
store the charge;
a discharge unit configured to discharge the charge remaining in the photoelectric conversion unit; and a discharge driving unit configured to be driven based on the discharge of the charge from the photoelectric conversion unit to the discharge unit, wherein a plurality of discharge driving units are arranged in series between the photoelectric conversion unit and the discharge unit, and wherein during capture of a moving image, driving is performed in a state where a potential of a discharge driving unit on the discharge unit side among the plurality of discharge driving units arranged in series is always kept reduced.

* * * * *